(12) United States Patent
Joshi et al.

(10) Patent No.: US 10,751,840 B2
(45) Date of Patent: Aug. 25, 2020

(54) MULTILAYER COMPOSITE BONDING MATERIALS AND POWER ELECTRONICS ASSEMBLIES INCORPORATING THE SAME

(71) Applicant: Toyota Motor Engineering & Manufacturing North America, Inc., Erlanger, KY (US)

(72) Inventors: Shailesh N. Joshi, Ann Arbor, MI (US); Ercan M. Dede, Ann Arbor, MI (US)

(73) Assignee: Toyota Motor Engineering & Manufacturing North America, Inc., Plano, TX (US)

( * ) Notice: Subject to any disclaimer, the term of this patent is extended or adjusted under 35 U.S.C. 154(b) by 334 days.

(21) Appl. No.: 15/883,890

(22) Filed: Jan. 30, 2018

(65) Prior Publication Data

US 2019/0232437 A1  Aug. 1, 2019

(51) Int. Cl.

| B23K 35/26 | (2006.01) |
|---|---|
| B22F 7/00 | (2006.01) |
| B23K 1/00 | (2006.01) |
| B23K 35/02 | (2006.01) |
| B22F 3/10 | (2006.01) |
| B23K 1/008 | (2006.01) |
| H01L 23/29 | (2006.01) |
| H01L 25/07 | (2006.01) |
| H01L 23/053 | (2006.01) |

(Continued)

(52) U.S. Cl.
CPC .......... *B23K 35/262* (2013.01); *B22F 3/1035* (2013.01); *B22F 7/008* (2013.01); *B23K 1/008* (2013.01); *B23K 1/0016* (2013.01); *B23K 35/025* (2013.01); *H01L 23/053* (2013.01); *H01L 23/293* (2013.01); *H01L 24/26* (2013.01); *H01L 25/072* (2013.01); *H01L 23/36* (2013.01)

(58) Field of Classification Search
CPC .... B23K 35/262; B23K 1/0016; B23K 1/008; B23K 35/025; B22F 3/1035; B22F 7/008; H01L 23/053; H01L 23/293; H01L 24/26; H01L 25/072; H01L 23/36
See application file for complete search history.

(56) References Cited

U.S. PATENT DOCUMENTS

| 6,199,751 B1 | 3/2001 | Gaynes et al. |
|---|---|---|
| 6,280,584 B1 | 8/2001 | Kumar et al. |
| 6,442,033 B1 | 8/2002 | Liu et al. |

(Continued)

*Primary Examiner* — Anthony J Zimmer
*Assistant Examiner* — Ricardo D Morales
(74) *Attorney, Agent, or Firm* — Dinsmore & Shohl LLP

(57) ABSTRACT

A multilayer composite bonding material with a plurality of thermal stress compensation layers is provided. The plurality of thermal stress compensation layers include a metal core layer, a pair of particle layers extending across the metal core layer such that the metal core layer is sandwiched between the pair of particle layers, and a pair of metal outer layers extending across the pair of particle layers such that the pair of particle layers are sandwiched between the pair of metal outer layers. A pair of low melting point (LMP) bonding layers extend across the pair of metal outer layers. The metal core layer, the pair of particle layers, and the pair of metal outer layers each have a melting point above a transient liquid phase (TLP) sintering temperature, and the pair of LMP bonding layers each have a melting point below the TLP sintering temperature.

20 Claims, 11 Drawing Sheets

(51) Int. Cl.
*H01L 23/00* (2006.01)
*H01L 23/36* (2006.01)

(56) References Cited

U.S. PATENT DOCUMENTS

| | | |
|---|---|---|
| 7,565,996 B2 | 7/2009 | Das |
| 8,643,185 B2 | 2/2014 | Kajiwara et al. |
| 9,147,812 B2 | 9/2015 | Andrews |
| 9,583,683 B2 | 2/2017 | Camras et al. |
| 2003/0189082 A1* | 10/2003 | Dockus ................ F28F 21/084 228/56.3 |
| 2007/0089811 A1* | 4/2007 | Ikeda ..................... H01L 24/83 148/536 |
| 2010/0224674 A1 | 9/2010 | Liu et al. |

* cited by examiner

MULTILAYER COMPOSITE BONDING MATERIALS AND POWER ELECTRONICS ASSEMBLIES INCORPORATING THE SAME

TECHNICAL FIELD

The present specification generally relates to bonding materials, and more particularly, to multilayer composite bonding materials for transient liquid phase bonding of semiconductor devices to substrates during the manufacture of power electronics assemblies.

BACKGROUND

Power electronics devices are often utilized in high-power electrical applications, such as inverter systems for hybrid electric vehicles and electric vehicles. Such power electronics devices include power semiconductor devices such as power insulated-gate bipolar transistors (IGBTs) and power transistors thermally bonded to a substrate. The substrate may then be further thermally bonded to a cooling structure, such as a heat sink.

With advances in battery technology and increases in electronics device packaging density, operating temperatures of power electronics devices have increased and are currently approaching 200° C. Accordingly, traditional electronic device soldering techniques no longer provide suitable bonding of semiconductor devices to substrates and alternative bonding techniques are needed. One such alternative bonding technique is transient liquid phase (TLP) sintering (also referred to herein as "TLP bonding"). The TLP sintering of a power electronics device utilizes a bonding layer sandwiched between a semiconductor device and substrate. The bonding layer at least partially melts and isothermally solidifies to form a TLP bond between the semiconductor device and substrate at TLP bonding temperatures (also referred to as TLP sintering temperatures) between about 280° C. to about 350° C. The semiconductor devices and substrates have different coefficients of thermal expansion (CTE) and large thermally-induced stresses (e.g., cooling stresses) may be generated between a semiconductor device and substrate upon cooling from a TLP sintering temperature. The large thermal cooling stresses due to CTE mismatch between the power semiconductor device and substrate may result in delamination between the semiconductor device and substrate of a power electronics device when currently known bonding layers are used to form the TLP bond.

Accordingly, a need exists for alternative bonding layers that compensate for thermal cooling stresses between power semiconductor devices thermally bonded to substrates via TLP sintering.

SUMMARY

In one embodiment, a multilayer composite bonding material with a plurality of thermal stress compensation layers is provided. The plurality of thermal stress compensation layers include a metal core layer, a pair of particle layers extending across the metal core layer such that the metal core layer is sandwiched between the pair of particle layers, and a pair of metal outer layers extending across the pair of particle layers such that the pair of particle layers are sandwiched between the pair of metal outer layers. A pair of low melting point (LMP) bonding layers extend across the pair of metal outer layers such that the plurality of thermal stress compensation layers are sandwiched between the pair of LMP bonding layers. The metal core layer, the pair of particle layers, and the pair of metal outer layers each have a melting point above a transient liquid phase (TLP) sintering temperature, and the pair of LMP bonding layers each have a melting point below the TLP sintering temperature. In embodiments, the TLP sintering temperature is in a range between about 280° C. and about 350° C. A thickness of the metal core layer may be greater than a thickness of each of the pair of metal outer layers. In the alternative, a thickness of the metal core layer may be less than a thickness of each of the pair of metal outer layers. In still another alternative, a thickness of the metal core layer may be greater than a thickness of one of the pair of metal outer layers and less than a thickness of another of the pair of metal outer layers. Also, an average diameter of particles that form one of the pair of particle layers may be generally equal to an average diameter of particles that form another of the pair of particle layers, or in the alternative, an average diameter of particles that form one of the pair of particle layers may be greater than an average diameter of particles that form another of the pair of particle layers. The multilayer composite bonding material has a graded stiffness or a graded flexural strength as a function of its thickness. In some embodiments, the metal core layer has a first stiffness, the pair of metal outer layers each have a second stiffness, and the first stiffness may be greater than or less than the second stiffness. In the alternative, or in addition to, a flexural strength of the metal core layer may be greater than or less than a flexural strength of each of the pair of metal outer layers.

In another embodiment, a power electronics assembly includes a semiconductor device extending across a substrate and a multilayer composite bonding material sandwiched between and transient liquid phase (TLP) bonded to the semiconductor device and the substrate. The multilayer composite bonding material includes a metal core layer, a pair of particle layers extending across the metal core layer such that the metal core layer is sandwiched between the pair of particle layers, and a pair of metal outer layers extending across the pair of particle layers such that the pair of particle layers are sandwiched between the pair of metal outer layers. A pair of low melting point (LMP) bonding layers extend across the pair of metal outer layers such that the plurality of thermal stress compensation layers are sandwiched between the pair of LMP bonding layers. The metal core layer, the pair of particle layers, and the pair of metal outer layers each have a melting point above a TLP sintering temperature, and the pair of LMP bonding layers each have a melting point below the TLP sintering temperature. In embodiments, the TLP sintering temperature is in a range between about 280° C. and about 350° C. A thickness of the metal core layer may be greater than a thickness of each of the pair of metal outer layers. In the alternative, a thickness of the metal core layer may be less than a thickness of each of the pair of metal outer layers. In still another alternative, a thickness of the metal core layer may be greater than a thickness of one of the pair of metal outer layers and less than a thickness of another of the pair of metal outer layers. Also, an average diameter of particles that form one of the pair of particle layers may be generally equal to an average diameter of particles that form another of the pair of particle layers. In the alternative, an average diameter of particles that form one of the pair of particle layers may be greater than an average diameter of particles that form another of the pair of particle layers. The multilayer composite bonding material has a graded stiffness or a graded flexural strength as a function of its thickness. In some embodiments, the metal core layer has a first stiffness and the pair of metal outer layers each have a second stiffness, and the first stiffness may be greater than or less than the second stiffness. In the alternative, or in addition to, a flexural strength of the metal core layer may be greater than or less than a flexural strength of each of the pair of metal outer layers.

In yet another embodiment, a process for manufacturing a power electronics assembly includes positioning a multilayer composite bonding material between a substrate and a semiconductor device to provide a substrate/semiconductor device assembly. The multilayer composite bonding material includes a metal core layer with a first stiffness and a first flexural strength and a pair of particle layers extending across the metal core layer such that the metal core layer is sandwiched between the pair of particle layers. A pair of metal outer layers with a second stiffness and a second flexural strength are included and extend across the pair of particle layers such that the pair of particle layers are sandwiched between the pair of metal outer layers. A pair of low melting point (LMP) bonding layers may be included and extend across the pair of metal outer layers such that the pair of metal outer layers are sandwiched between the pair of LMP bonding layers. The pair of LMP bonding layers each have a melting point that is less than a TLP sintering temperature and the metal core layer, the pair of particle layers, and the pair of metal outer layers each have a melting point greater than the TLP sintering temperature. In embodiments, the TLP sintering temperature is between about 280° C. and about 350° C. The substrate/semiconductor device assembly is heated to the TLP sintering temperature such that the pair of LMP bonding layers at least partially melt and form a TLP bond with the substrate and the semiconductor device. The substrate/semiconductor device assembly is cooled from the TLP sintering temperature to ambient temperature and the multilayer composite bonding material compensates for thermal contraction mismatch between the semiconductor device and the substrate during cooling from the TLP sintering temperature to ambient temperature. In some embodiments, the first stiffness is not equal to the second stiffness. In the alternative, or in addition to, the first flexural strength is not equal to the second flexural strength.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Figure 1:
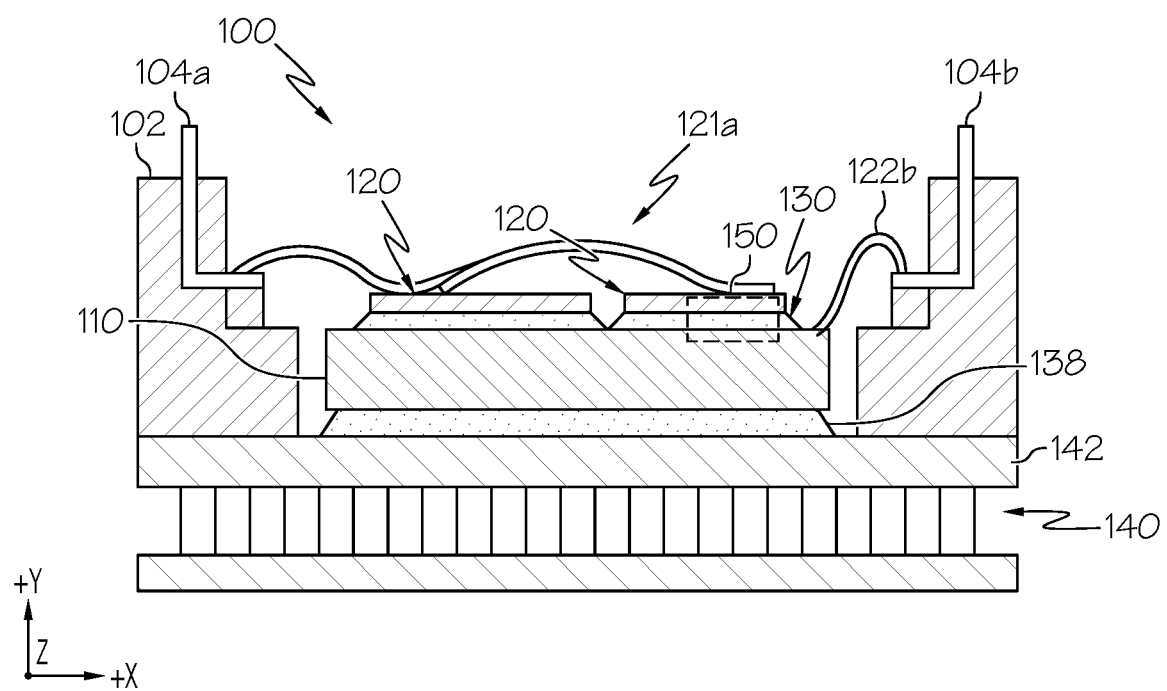
FIG. 1 schematically depicts a side view of a power electronics assembly having a power semiconductor device thermally bonded to a substrate with a multilayer composite bonding material according to one or more embodiments shown and described herein.

One non-limiting example of a multilayer composite bonding material for thermally bonding a substrate to a semiconductor device includes a plurality of thermal stress compensation layers that compensate for contraction and expansion mismatch between a substrate and a semiconductor device during manufacture and operation of a power electronics assembly. The plurality of thermal stress compensation layers include a plurality of continuous metal layers and a plurality of particle layers disposed between the plurality of metal layers. As used herein, the "continuous metal layer" refers to a solid non-porous metal layer. The multilayer composite bonding material compensates for thermally-induced stresses generated or resulting from fabrication and operation of the power electronics assembly. The thermally-induced stresses are due to coefficient of thermal expansion (CTE) mismatch between the semiconductor device and the substrate of the power electronics assembly. The multilayer composite bonding material includes a continuous metal core layer (also referred to herein simply as "metal core layer"), a pair of particle layers, and a pair of continuous metal outer layers (also referred to herein simply as "metal outer layer" or "metal outer layers"). As used herein, the phrase "particle layer" refers to a layer of the multilayer composite bonding material formed from a plurality of particles. The metal core layer is sandwiched between the pair of particle layers and the pair of particle layers are sandwiched between the pair of metal outer layers. The metal core layer may have a first stiffness and the pair of metal outer layers may have a second stiffness that may or may not be the same as the first stiffness. As used herein, the term "stiffness" refers to the elastic modulus of a layer, i.e., the resistance of deflection of a layer resulting from a force applied to the layer. Accordingly, stiffness is a property of the material from which a layer is formed. When the second stiffness is not equal to the first stiffness, the multilayer composite bonding material has a graded stiffness as a function of its thickness. As used herein, the term "graded stiffness" refers to a change in stiffness. In the alternative, or in addition to, the metal core layer may have a first flexural strength and one or both of the pair of metal outer layers may have a second flexural strength that may or may not be the same as the first flexure strength. As used herein, the phrase "flexural strength" refers to the bending yield strength (σ) of a metal layer in a three-point bend test defined as:

$$\sigma = F \cdot L / (2w \cdot t^2)$$ Eqn. 1 where 'F' is the force on the metal layer resulting in plastic yield, 'L' is the length of the metal layer (X direction depicted in the figures) between supports, 'w' is the width of the metal layer (Z direction depicted in the figures) and 't' is the thickness of the metal layer (Y direction depicted in the figures). Accordingly, the flexural strength of a layer provides a measure of the layer's flexibility and is dependent on the material and the physical dimensions of a layer. When the second flexural strength is not equal to the first flexural strength, the multilayer composite bonding material has a graded flexural strength as a function of its thickness. As used herein, the term "graded flexural strength" refers to a change in flexural strength. The metal core layer, the pair of particle layers and the pair of metal outer layers each have a melting point that is greater than a transient liquid phase (TLP) sintering temperature used to provide a TLP bond between the semiconductor device and the substrate. In some embodiments, the multilayer composite bonding material may be sandwiched between a pair of low melting point (LMP) bonding layers that have a melting point that is less than the TLP sintering temperature. Various embodiments of multilayer composite bonding materials and power electronics assemblies using multilayer composite bonding materials will be described in more detail herein.

Referring initially to FIG. 1, one embodiment of a power electronics assembly 100 is illustrated. The power electronics assembly 100 generally comprises a substrate 110, two semiconductor devices 120 thermally bonded to the substrate via a multilayer composite bonding material 130A, a cooling structure 140, and a package housing 102.

The thicknesses of the substrate 110 and the semiconductor devices 120 may depend on the intended use of the power electronics assembly 100. In one embodiment, the substrate 110 has a thickness within the range of about 2.0 millimeters (mm) to about 4.0 mm, and the semiconductor device 120 has a thickness within the range of about 0.1 mm to about 0.3 mm. For example and without limitation, the substrate may have a thickness of about 3.0 mm and the semiconductor device 120 may have a thickness of about 0.2 mm. It should be understood that other thicknesses may be utilized.

The substrate 110 may be formed from a thermally conductive material such that heat from the semiconductor devices 120 is transferred to the cooling structure 140. The substrate 110 may be a metal substrate formed copper (Cu), e.g., oxygen free Cu, aluminum (Al), and alloys thereof, or in the alternative, the substrate 110 may be a formed from a semiconductor material (e.g., silicon). The semiconductor devices 120 may be formed from a wide band gap semiconductor material suitable for the manufacture or production of power semiconductor devices such as power IGBTs and power transistors. In embodiments, the semiconductor devices 120 may be formed from wide band gap semiconductor materials including without limitation silicon carbide (SiC), silicon dioxide ($SiO_2$), aluminum nitride (AlN), gallium nitride (GaN), gallium oxide ($Ga_2O_3$), boron nitride (BN), diamond, and the like. In embodiments, the substrate 110 and the semiconductor devices 120 may comprise a coating, e.g., nickel (Ni) plating, to assist in the TLP sintering of the semiconductor devices 120 to the substrate 110.

As depicted in FIG. 1, a substrate 110 is thermally bonded to two semiconductor devices 120 via the multilayer composite bonding material 130A. More or fewer semiconductor devices 120 may be attached to the substrate 110. In some embodiments, heat generating devices other than power semiconductor devices may be attached to the substrate 110. The semiconductor devices 120 may be power semiconductor devices such as IGBTs, power diodes, power metal-oxide-semiconductor field-effect transistors (MOSFETs), power transistors, and the like. In one embodiment, the semiconductor devices 120 of one or more power electronics assemblies are electrically coupled to form an inverter circuit or system for vehicular applications, such as for hybrid vehicles or electric vehicles, for example.

The substrate 110 is thermally coupled to the cooling structure 140 via a bond layer 138. In one embodiment, the cooling structure 140 comprises an air-cooled heat sink. In an alternative embodiment, the cooling structure 140 comprises a liquid-cooled heat sink, such as a jet impingement or channel-based heat sink device. The substrate 110 of the illustrated embodiment is directly bonded to a first surface 142 of the cooling structure 140 via the bond layer 138 without any additional interface layers (e.g., additional metal base plates). The substrate 110 may be bonded to the cooling structure 140 using a variety of bonding techniques, such as by TLP sintering, solder, brazing, or diffusion bonding, for example. However, in an alternative embodiment, one or more thermally conductive interface layers may be positioned between the substrate 110 and the cooling structure 140.

Still referring to FIG. 1, the substrate 110 may be maintained within a package housing 102, which may be made of a non-electrically conductive material such as plastic, for example. The package housing 102 may be coupled to the cooling structure 140 by a variety of mechanical coupling methods, such as by the use of fasteners or adhesives, for example. In other embodiments, the package housing 102 may be coupled to the substrate 110. In still other embodiments, no package housing is provided.

Within the power electronics assembly 100 may be a first electrical contact 104a and a second electrical contact 104b to provide electrical power connections to the semiconductor devices 120. The first electrical contact 104a may correspond to a first voltage potential and the second electrical contact 104b may correspond to a second voltage potential. In the illustrated embodiment, the first electrical contact 104a is electrically coupled to a first surface of the semiconductor devices 120 via a first electrical wire 121a, and the second electrical contact 104b is electrically coupled to a second surface of the semiconductor devices 120 via a second electrical wire 121b and the substrate 110. It should be understood that other electrical and mechanical configurations are possible, and that embodiments are not limited by the arrangement of the components illustrated in the figures.

Figure 2:
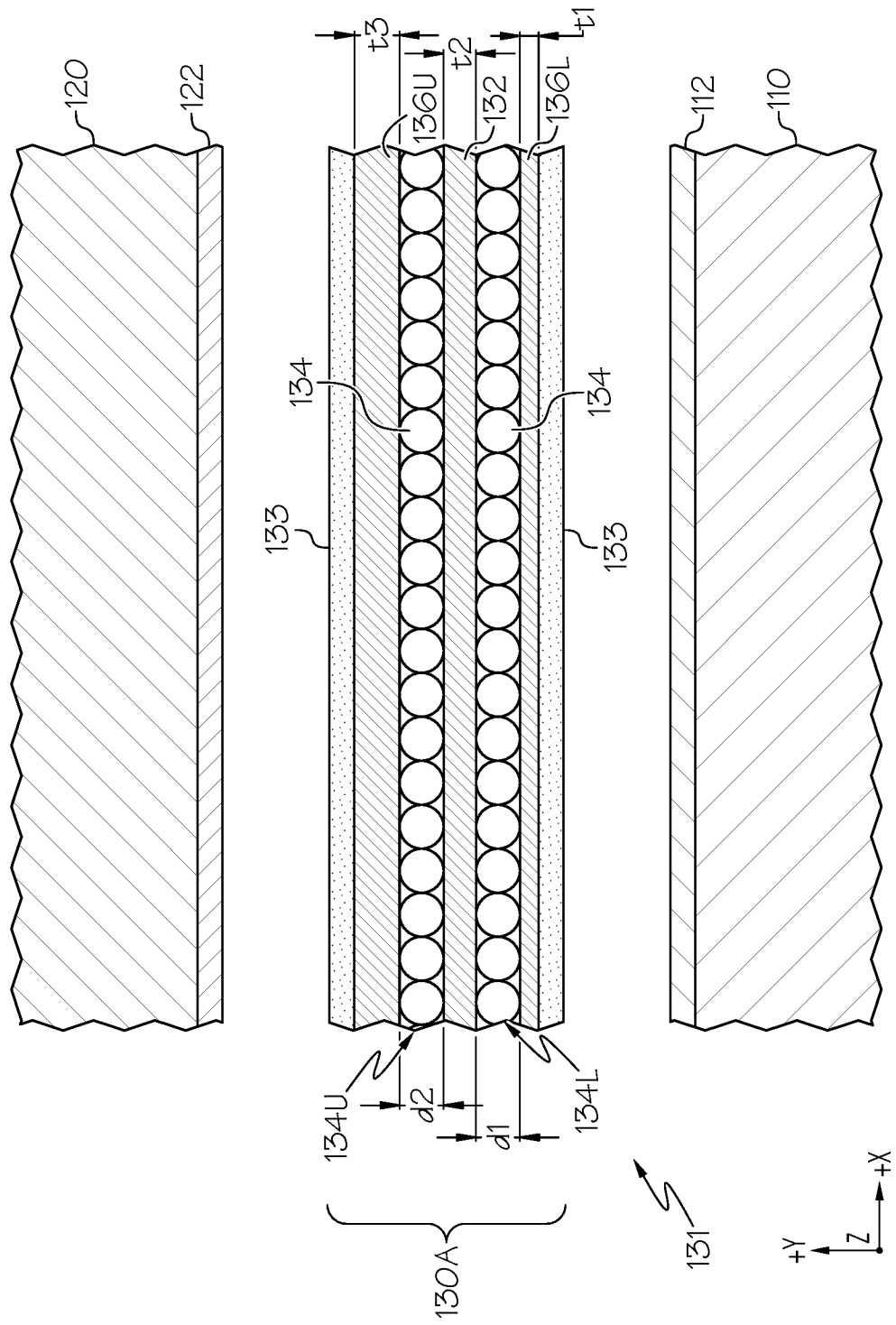
FIG. 2 schematically depicts an exploded view of box 150 depicted in FIG. 1 according to one or more embodiments shown and described herein.

Referring now to FIG. 2, an exploded view of the region designated by box 150 in FIG. 1 before TLP sintering of the semiconductor devices 120 to the substrate 110 is schematically depicted. The multilayer composite bonding material 130A comprises a plurality of thermal stress compensation layers 131 that include a metal core layer 132, a lower (−Y direction) particle layer 134L and an upper (+Y direction) particle layer 134U (also referred to herein as a pair of particle layers 134U, 134L), and a lower metal outer layer 136L and an upper metal outer layer 136U (also referred to herein as a pair of metal outer layers 136L, 136U). The metal core layer 132 may be sandwiched between and in direct contact with the pair of particle layers 134U, 134L, and the pair of particle layers 134U, 134L may be sandwiched between and in direct contact with the pair of metal outer layers 136U, 136L as depicted in FIG. 2.

The lower metal outer layer 136L has a thickness t1, the metal core layer 132 has a thickness t2 that is greater than t1, and the upper metal outer layer 136U has a thickness t3 that is greater than t2 (i.e., t1<t2<t3). Accordingly, the metal core layer 132 and the pair of metal outer layers 136L, 136U (referred to herein collectively as "metal layers 132, 136L, 136U") increase in thickness as a function of increasing thickness (+Y direction) of the multilayer composite bonding material 130A. Also, particles 134 forming the lower particle layer 134L have an average particle diameter d1 and particles 134 forming the upper particle layer 134U have an average particle diameter d2 that is equal to d1 (i.e., d1=d2).

The multilayer composite bonding material 130A described herein compensates thermally-induced stresses, e.g., thermal cooling stresses, resulting from fabrication (e.g., TLP sintering) and operational conditions (e.g., transient electric loads causing high changes in temperature). Because the substrate 110 and the semiconductor devices 120 of the power electronics assembly 100 are made of differing materials, differences in the CTE for each material may cause large thermally-induced stresses within and between the substrate 110, the semiconductor devices 120 and the multilayer composite bonding material 130A. It should be understood that the large thermally-induced stresses may result in failure of the power electronics assembly 100 due to fracturing of the substrate 110 or failure of a traditional TLP bonding material (e.g., delamination) between the substrate 110 and one or both of the semiconductor devices 120. The use of the multilayer composite bonding material 130A to TLP bond the substrate 110 to the semiconductor devices 120 alleviates or mitigates such stresses.

The multilayer composite bonding material 130A, and other multilayer composite bonding materials described herein, compensates for the thermal expansion and contraction experienced by the substrate 110 and semiconductor devices 120. In some embodiments, the multilayer composite bonding material 130A, and other multilayer composite bonding materials described herein, compensate for the thermal expansion and contraction experienced by the substrate 110 and semiconductor devices 120 using a graded stiffness across the thickness (Y direction) of the multilayer composite bonding material. In the alternative, or in addition to, the multilayer composite bonding material 130A, and other multilayer composite bonding materials described herein, compensate for the thermal expansion and contraction experienced by the substrate 110 and semiconductor devices 120 using a graded flexural strength across the thickness (Y direction) of the multilayer composite bonding material. The graded stiffness and/or graded flexural strength allow the multilayer composite bond material to plastically deform and not delaminate due to the CTE mismatch between the substrate 110 and semiconductor devices 120, and yet provide sufficient stiffness such that the semiconductor devices 120 are adequately secured to the substrate 110 for subsequent manufacturing steps performed on the semiconductor devices 120. The multilayer composite bonding material 130A also provides sufficient high temperature bonding strength between the substrate 110 and semiconductor devices 120 during operating temperatures approaching and possibly exceeding 200° C.

The multilayer composite bonding material 130A described herein may be formed from a variety of materials such that a graded stiffness across the thickness of the multilayer composite bonding material 130A is provided. As noted above, in some embodiments, the stiffness of the metal core layer 132 (first stiffness) is less than the stiffness of the pair of metal outer layers 136U, 136L (second stiffness). For example, the metal core layer 132 may be formed from Al with an elastic modulus ($E_{Al}$) of about 69.0 gigapascals (GPa) and the pair of metal outer layers 136L, 136U may be formed from silver (Ag) with an elastic modulus ($E_{Ag}$) of about 72.4 GPa or copper (Cu) with an elastic modulus ($E_{Cu}$) of about 115.0 GPa. In another example, the metal core layer 132 may be formed from manganese (Mg) with an elastic modulus ($E_{Mg}$) of about 45.0 GPa and the pair of metal outer layers 136L, 136U may be formed from Ag ($E_{Ag}$≈72.4 GPa) or Cu ($E_{Cu}$=115.0 GPa). In other embodiments, the stiffness of the metal core layer 132 is greater than the stiffness of the pair of metal outer layers 136L, 136U. Table 1 below provides a non-limiting summary of possible materials used for the metal core layer 132 and the pair of metal outer layers 136L, 136U. It should be understood that the metals listed in Table 1 from the which the metal core layer 132 and the pair of metal outer layers 136L, 136U are formed include alloys of the metals, e.g., Al alloys, Ag alloys, Cu alloys and Mg alloys which may be used to alter and adjust the stiffness of a given layer and the graded stiffness of the multilayer composite bonding material 130A.

TABLE 1

| Core Layer (CL)-Outer Layer (OL) Structure | Core Layer (Elastic Modulus) | Outer Layers ($E_{Outer}$) |
|---|---|---|
| Ag/Al/Ag ($E_{CL} < E_{OL}$) | Al ($E_{Al}$ ≈ 69.0 GPa) | Ag ($E_{Ag}$ ≈ 72.4 GPa) |
| Cu/Al/Cu ($E_{CL} < E_{OL}$) | Al ($E_{Al}$ ≈ 69.0 GPa) | Cu ($E_{Cu}$ ≈ 115.0 GPa) |
| Ag/Mg/Ag ($E_{CL} < E_{OL}$) | Mg ($E_{Mg}$ ≈ 45.0 GPa) | Ag ($E_{Ag}$ ≈ 72.4 GPa) |
| Cu/Mg/Cu ($E_{CL} < E_{OL}$) | Mg ($E_{Mg}$ ≈ 45.0 GPa) | Cu ($E_{Cu}$ ≈ 115.0 GPa) |

In the alternative, or in addition to the multilayer composite bonding material 130A having a graded stiffness, the multilayer composite bonding material 130A may have a graded flexural strength as a function of its thickness. In one non-limiting example, the metal layers 132, 136L, 136U are formed from the same material (e.g., Al, Cu or Ni) and the flexural strength of the lower metal outer layer 136L (σ1) is less than the flexural strength of the metal core layer 132 (σ2) since the thickness t1 of the lower metal outer layer 136L is less than thickness t2 of the metal core layer 132 and the widths 'w' of the metal layers 132, 136L, 136U are equal (e.g., see Eqn. 1). Also, the flexural strength σ2 of the metal core layer 132 is less than the flexural strength of the upper metal outer layer 136U (σ3) since the thickness t2 of the metal core layer 132 is less than the thickness t3 of the upper metal outer layer 136U (i.e., σ1<σ2<σ3). Accordingly, the multilayer composite bonding material 130A has an increase in flexural strength as a function of increasing thickness (+Y direction) of the multilayer composite bonding material 130A.

Generally, the metal layers 132, 136L, 136U comprise flat thin films. The thickness of the lower metal outer layer 136L may be between about 10 micrometers (μm) and about 150 μm. In embodiments, the lower metal outer layer 136L has a thickness between about 25 μm and about 100 μm. In other embodiments, the lower metal outer layer 136L has a thickness between about 35 μm and 75 μm, for example a thickness of 50 μm. The thickness of the metal core layer 132 may be between about 25 μm and about 200 μm. In embodiments, the metal core layer 132 has a thickness between about 50 μm and about 150 μm. In other embodiments, the metal core layer 132 has a thickness between about 75 μm and 125 μm, for example a thickness of 100 μm. The thickness of the upper metal outer layer 136U may be between about 50 μm and about 500 μm. In embodiments, the upper metal outer layer 136U has a thickness between about 100 μm and about 400 μm. In other embodiments, the upper metal outer layer 136U has a thickness between about 200 μm and 300 μm, for example a thickness of 250 μm. Generally, the pair of particle layers 134L, 134U comprise spherical particles 134. However, in embodiments, the pair of particle layers 134L, 134U comprise non-spherical particles 134 (not shown). The average diameter of the pair of particles layers 134L, 134U (i.e., the average diameter of the particles 134) may be between about 10 μm and about 50 μm. In embodiments, the average diameter of the pair of particles layers 134L, 134U is between about 15 μm and about 45 μm. In other embodiments, the average diameter of the pair of particles layers 134L, 134U is between about 20 μm and about 40 μm, for example an average diameter of about 30 μm. While FIG. 2 depicts the pair of particles layers 134L, 134U with a single row of particles 134 along the thickness (Y direction) of the multilayer composite bonding material 130A, it should be understood that the pair of particle layers 134L, 134U may include a plurality of rows of particles 134 along the thickness of the multilayer composite bonding material 130A.

In embodiments, the multilayer composite bonding material 130A may be sandwiched between and in direct contact with a pair of low melting point (LMP) bonding layers 133 as depicted in FIG. 2. Also, a bonding layer 112 may extend across a surface of the substrate 110 facing the multilayer composite bonding material 130A and/or a bonding layer 122 may extend across a surface of the semiconductor devices 120 facing the multilayer composite bonding material 130A. Each of the pair of LMP bonding layers 133 has a melting point that is less than a melting point of any of the thermal stress compensation layers 131. Particularly, each of the pair of LMP bonding layers 133 has a melting point that is less than a TLP sintering temperature used to TLP bond the semiconductor device 120 to the substrate 110, and the metal core layer 132, the pair of particle layers 134L, 134U, the pair of metal outer layers 136L, 136U each have a melting point that is greater than a TLP sintering temperature used to TLP bond the semiconductor device 120 to the substrate 110. In embodiments, the TLP sintering temperature is in a range between about 280° C. and about 350° C. For example, the TLP sintering temperature may be greater than about 300° C. and less than about 330° C.

In one non-limiting example, the pair of LMP bonding layers 133, and the bonding layers 112, 122 may be formed from Sn with a melting point of about 232° C., whereas the metal core layer 132, the pair of particle layers 134L, 134U, and the pair of metal outer layers 136L, 136U are formed from materials such as Al, Ag, Cu, and Mg have a melting point of about 660° C., 962° C., 1085° C. and 650° C., respectively. Accordingly, the pair of LMP bonding layers 133, and the bonding layers 112, 122 at least partially melt and the metal core layer 132, the pair of particle layers 134L, 134U, and the pair of metal outer layers 136L, 136U do not melt during TLP bonding of the semiconductor devices 120 to the substrate 110. In another non-limiting example, the pair of LMP bonding layers 133 may be formed from Sn, the pair of bonding layers 112, 122 are formed from nickel (Ni) with a melting point of 1455° C., and the metal core layer 132, the pair of particle layers 134L, 134U, and the pair of metal outer layers 136L, 136U are formed from materials such as Al, Ag, Cu, and Mg. Accordingly, the pair of LMP bonding layers 133 at least partially melt and the pair of bonding layers 112, 122, the metal core layer 132, the pair of particle layers 134L, 134U, and the pair of metal outer layers 136L, 136U do not melt during TLP bonding of the semiconductor devices 120 to the substrate 110. It should be understood that a LMP coating with a melting point less than the TLP sintering temperature may be included on the particles 134 of the pair of particle layers 134L, 134U. That is, the particles 134 may have a thin LMP coating (not shown) such that the particles may be TLP bonded to each other, to the metal core layer 132 and to the pair of metal outer layers 136L, 136U during TLP bonding of the semiconductor devices 120 to the substrate 110. However, the particles 134 (without the LMP coating) do not melt during TLP bonding of the semiconductor devices 120 to the substrate 110. In the alternative, or in addition to, the metal core layer 132 and/or the pair of metal outer layers 136L, 136U may have a thin LMP coating (not shown) on surfaces in contact with the particles 134 such that the particles 134 may be TLP bonded to the metal core layer 132 and/or the pair of metal outer layers 136L, 136U during TLP bonding of the semiconductor devices 120 to the substrate 110.

The metal layers 132, 136L, 136U, and other metal layers described herein, and the particle layers 134L, 134U, and other particle layers described herein, may be formed using conventional multilayer thin film and particle forming techniques. Non-limiting techniques for forming the metal layers 132, 136L, 136U include rolling, chemical vapor deposition (CVD), physical vapor deposition (PVD), electrolytic deposition, electroless deposition, and the like. Non-limiting techniques for forming the particles 134 include liquid atomization, gas atomization, centrifugal atomization, centrifugal disintegration, and the like.

The multilayer composite bonding material 130A, and other multilayer composite bonding materials described herein, may be formed using conventional multilayer thin film forming techniques. Non-limiting examples of forming the multilayer composite bonding material 130A include roll bonding the metal layers 132, 136L, 136U and the particle layers 134L, 134U together, pressing the metal layers 132, 136L, 136U and the particle layers 134L, 134U together, and the like.

The pair of bonding layers 112, 122 and the pair of LMP bonding layers 133, and other bonding layers described herein, may be formed using conventional thin film forming techniques. Non-limiting examples include roll bonding, CVD, PVD, electrolytic deposition, electroless deposition, etc., of the pair of bonding layers 112, 122 onto the substrate 110 and the semiconductor device 120, respectively, and/or the pair of LMP bonding layers 133 onto the pair of metal outer layers 136L, 136U.

Figure 3:
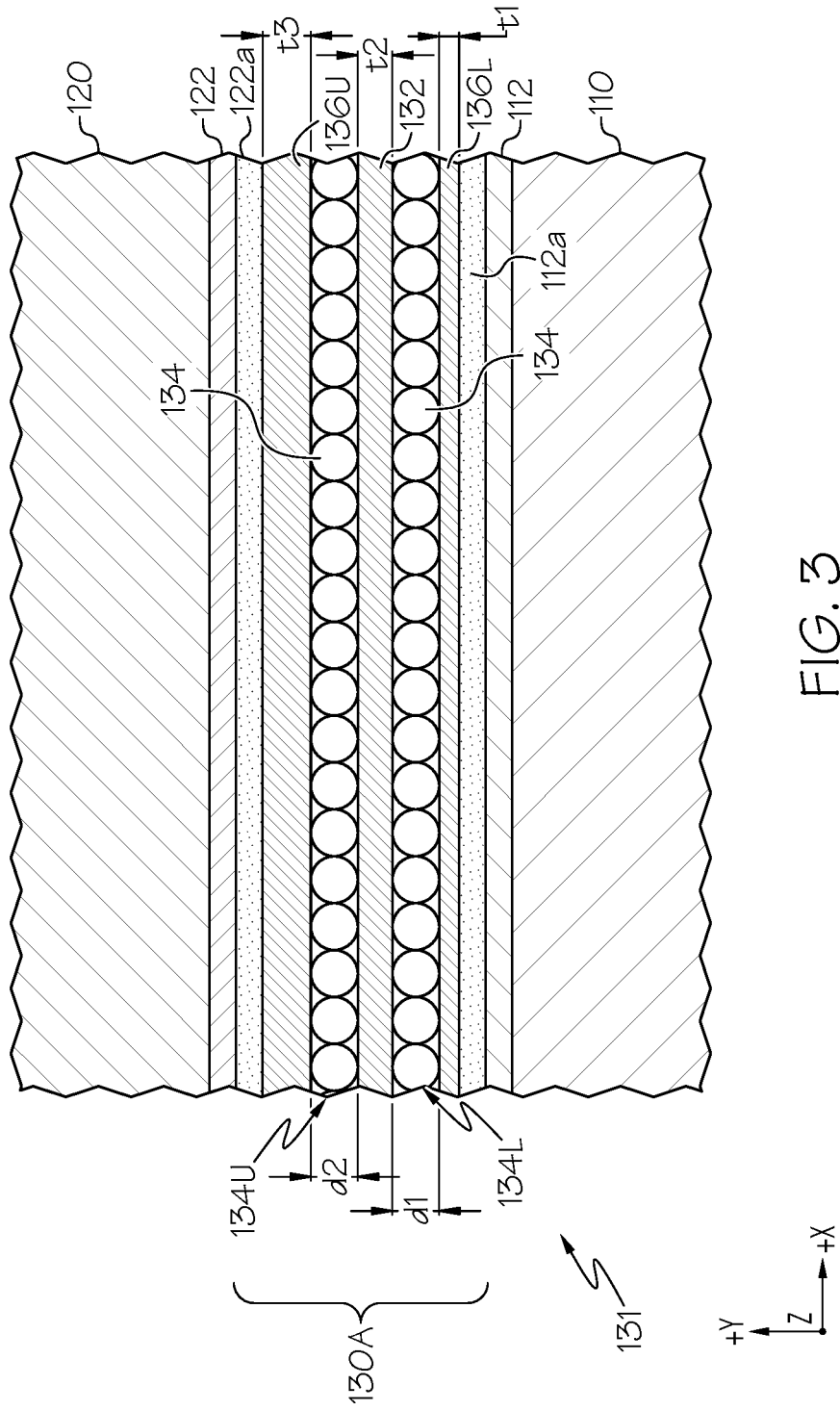
FIG. 3 schematically depicts an enlarged view of box 150 depicted in FIG. 1.

Referring now to FIG. 3, an enlarged view of the region designated by box 150 in FIG. 1 after the semiconductor devices 120 have been TLP bonded to the substrate 110 is schematically depicted. As illustrated in FIG. 3, after the semiconductor devices 120 have been TLP bonded to the substrate 110, the metal core layer 132, the pair of particle layers 134L, 134U, and the pair of metal outer layers 136L, 136U remain as in FIG. 2. That is, the metal core layer 132, the pair of particle layers 134L, 134U, and the pair of metal outer layers 136L, 136U do not melt during the TLP bonding process and generally remain the same thickness (Y direction) as before the TLP bonding process. It is understood that diffusion may occur between the metal core layer 132 and the pair of particle layers 134L, 134U, and between the pair of particle layers 134L, 134U and the pair of metal outer layers 136L, 136U during the TLP bonding process, but neither the metal core layer 132, the pair of particle layers 134L, 134U, nor the pair of metal outer layers 136L, 136U melt during the TLP bonding process. In contrast, the pair of LMP bonding layers 133 at least partially melt and form TLP bonding layers 112a and 122a. Although FIG. 3 depicts two layers between the substrate 110 and the lower metal outer layer 136L (i.e., bonding layers 112, 112a) and two layers between the semiconductor device 120 and the upper metal outer layer 136U (i.e., bonding layers 122, 122a), in embodiments only one layer (e.g., bonding layer 112a) may be between the substrate 110 and the lower metal outer layer 136L and/or and only one layer (e.g., bonding layer 122a) may be between the semiconductor device 120 and the upper metal outer layer 136U. In other embodiments, no layers may be between the substrate 110 and the lower metal outer layer 136L and/or the semiconductor device 120 and the upper metal outer layer 136U. That is, all of the bonding layers 133, 112 and 122 diffuse into the adjacent metal outer layers 136L, 136U, substrate 110 and/or semiconductor device 120 thereby resulting in a clearly defined TLP bonding layer 112a and/or 122a not being present.

Figure 4:
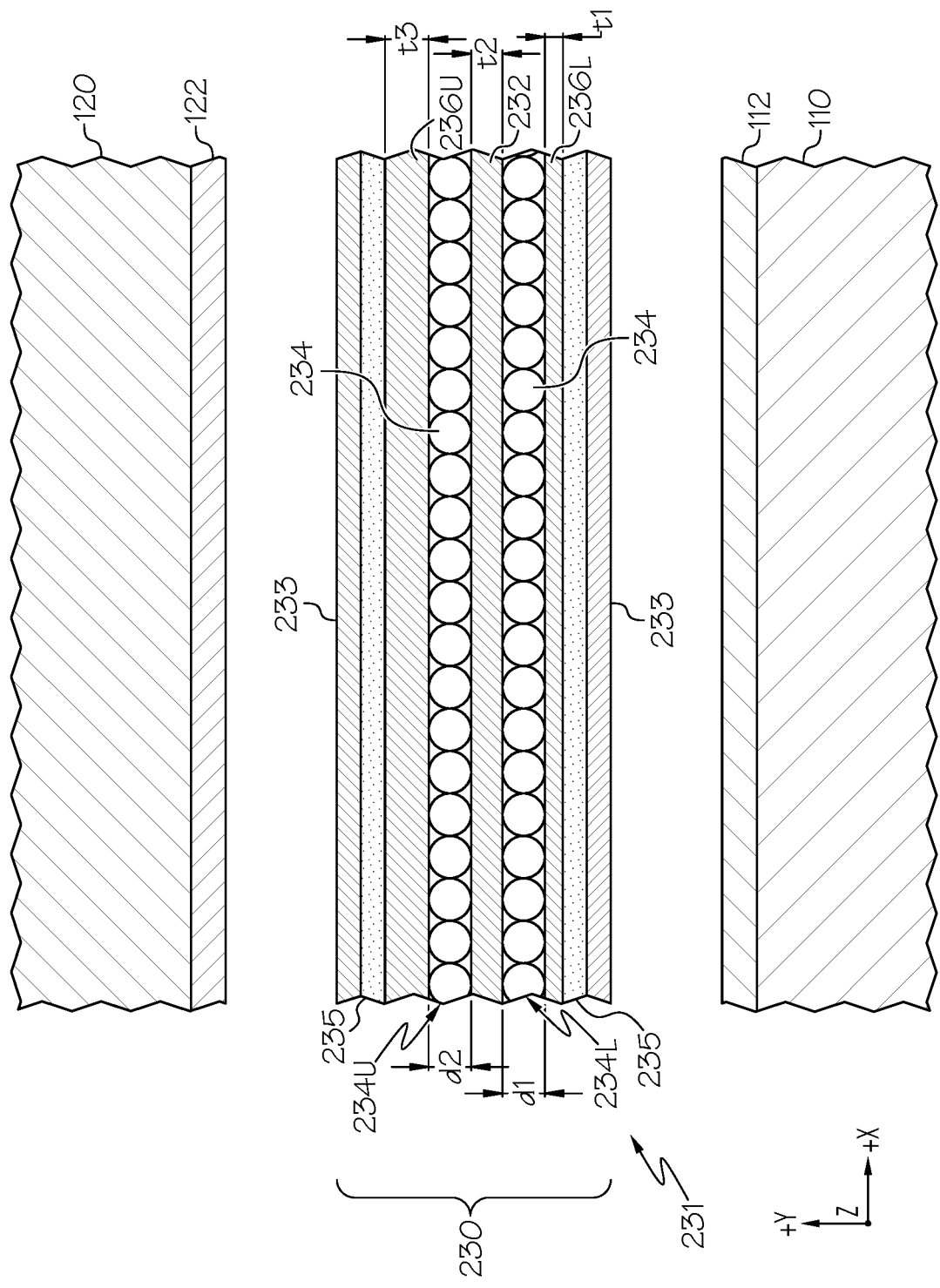
FIG. 4 schematically depicts an exploded view of box 150 depicted in FIG. 1 according to one or more embodiments shown and described herein.

Referring now to FIG. 4, an exploded view of the region designated by box 150 in FIG. 1 before TLP sintering of the semiconductor devices 120 to the substrate 110 according to another embodiment is schematically depicted. Particularly, a multilayer composite bonding material 230 includes a plurality of thermal stress compensation layers 231 comprising a metal core layer 232, a pair of particle layers 234L, 234U, and a pair of metal outer layers 236L, 236U. The metal core layer 232 may be disposed between and in direct contact with the pair of particle layers 234L, 234U and the first of particle layers 234L, 234U may be disposed between and in direct contact with the pair of metal outer layers 236L, 236U. Also, a pair of bonding layers 235 may be disposed on and in direct contact with the pair of metal outer layers 236L, 236U as depicted in FIG. 4.

Similar to the multilayer composite bonding material 130A, the lower metal outer layer 236L of the multilayer composite bonding material 230 has a thickness t1, the metal core layer 232 has a thickness t2 that is greater than t1, and the upper metal outer layer 236U has a thickness t3 that is greater than t2 (i.e., t1<t2<t3). Accordingly, the metal layers 232, 236L, 236U increase in thickness as a function of increasing thickness (+Y direction) of the multilayer composite bonding material 230. Also, particles 234 forming the lower particle layer 234L have an average particle diameter d1 and particles 234 forming the upper particle layer 234U have an average particle diameter d2 that is equal to d1 (i.e., d1=d2).

The multilayer composite bonding material 230 described herein may be formed from a variety of materials such that a graded stiffness across the thickness of the multilayer composite bonding material 230 is provided. In some embodiments, the stiffness of the metal core layer 232 (first stiffness) is less than the stiffness of the pair of metal outer layers 236L, 236U (second stiffness). In such embodiments, the metal core layer 232 may be formed from Al ($E_{Al}{\approx}69.0$ GPa) and the pair of metal outer layers 236L, 236U may be formed from Ag ($E_{Ag}{\approx}72.4$ GPa) or Cu ($E_{Cu}{\approx}115.0$ GPa). In another example, the metal core layer 232 may be formed from Mg ($E_{Mg}{\approx}45.0$ GPa) and the pair of metal outer layers 236L, 236U may be formed from Ag ($E_{Ag}{\approx}72.4$ GPa) or Cu ($E_{Cu}{\approx}115.0$ GPa). In other embodiments, the stiffness of the metal core layer 232 is greater than the stiffness of the pair of metal outer layers 236L, 236U.

Generally, the metal layers 232, 236L, 236U comprise flat thin films. The thickness of the lower metal outer layer 236L may be between about 10 μm and about 150 μm. In embodiments, the lower metal outer layer 236L has a thickness between about 25 μm and about 100 μm. In other embodiments, the lower metal outer layer 236L has a thickness between about 35 μm and about 75 μm, for example a thickness of 50 μm. The thickness of the metal core layer 132 may be between about 25 μm and about 200 μm. In embodiments, the metal core layer 232 has a thickness between about 50 μm and about 150 μm. In other embodiments, the metal core layer 232 has a thickness between about 75 μm and about 125 μm, for example a thickness of 100 μm. The thickness of the upper metal outer layer 236U may be between about 50 μm and about 500 μm. In embodiments, the upper metal outer layer 236U has a thickness between about 100 μm and about 400 μm. In other embodiments, the upper metal outer layer 236U has a thickness between about 200 μm and 300 μm, for example a thickness of 250 μm. Generally, the pair of particle layers 234L, 234U comprise spherical particles 234. However, in embodiments, the pair of particle layers 234L, 234U comprise non-spherical particles 234 (not shown). The average diameter of the pair of particles layers 234L, 234U (i.e., the average diameter of the particles 234 in the pair of particle layers 234L, 234U) may be between about 10 μm and about 50 μm. In embodiments, the average diameter of the pair of particles layers 234L, 234U is between about 15 μm and about 45 μm. In other embodiments, the average diameter of the pair of particles layers 234L, 234U is between about 20 μm and about 40 μm, for example an average diameter of about 30 μm. While FIG. 4 depicts the pair of particles layers 234L, 234U with a single row of particles 234 along the thickness (Y direction) of the multilayer composite bonding material 230, it should be understood that the pair of particle layers 234L, 234U may include a plurality of rows of particles 234 along the thickness of the multilayer composite bonding material 230.

In embodiments, the multilayer composite bonding material 230 may be sandwiched between and in direct contact with a pair of LMP bonding layers 233 as depicted in FIG. 4. Also, the bonding layer 112 may extend across a surface of the substrate 110 facing the multilayer composite bonding material 230 and/or the bonding layer 122 may extend across a surface of the semiconductor devices 120 facing the multilayer composite bonding material 230. Each of the pair of LMP bonding layers 233 has a melting point that is less than a melting point of any of the thermal stress compensation layers 231 and the pair of bonding layers 235. Particularly, each of the pair of LMP bonding layers 233 has a melting point that is less than a TLP sintering temperature used to TLP bond the semiconductor device 120 to the substrate 110, and the metal core layer 232, the pair of particle layers 234L, 234U, the pair of metal outer layers 236L, 236U, and the pair of bonding layers 235 each have a melting point that is greater than a TLP sintering temperature used to TLP bond the semiconductor device 120 to the substrate 110. In embodiments, the TLP sintering temperature is in a range between about 280° C. and about 350° C. For example, the TLP sintering temperature may be greater than about 300° C. and less than about 330° C.

In one non-limiting example, the pair of LMP bonding layers 233, and the bonding layers 112 and/or 122 may be formed from Sn, whereas the metal core layer 232, the pair of particle layers 234L, 234U, and the pair of metal outer layers 236L, 236U are formed from materials such as Al, Ag, Cu, and Mg. Also, the pair of bonding layers 235 may be formed from a material such as Ni. Accordingly, the pair of LMP bonding layers 233, and the bonding layers 112 and/or 122 at least partially melt and the metal core layer 232, the pair of particle layers 234L, 234U, the pair of metal outer layers 236L, 236U, and the pair of bonding layers 235 do not melt during TLP bonding of the semiconductor devices 120 to the substrate 110. In another non-limiting example, the pair of LMP bonding layers 233 may be formed from Sn, the metal core layer 232, the pair of particle layers 234L, 234U, and the pair of metal outer layers 236L, 236U are formed from materials such as Ni, Al, Ag, Cu, and Mg, and the pair of bonding layers 112, 122 and the pair of bonding layers 235 are formed from Ni. Accordingly, the pair of LMP bonding layers 233 at least partially melt and the pair of bonding layers 112, 122, the pair of bonding layers 235, the metal core layer 232, the pair of particle layers 234L, 234U, and the pair of metal outer layers 236L, 236U do not melt during TLP bonding of the semiconductor devices 120 to the substrate 110. It should be understood that a LMP coating with a melting point less than the TLP sintering temperature may be included on the particles 234 of the pair of particle layers 234L, 234U. That is, the particles 234 of the pair of particle layers 234L, 234U may have a thin LMP coating (not shown) such that the particles 234 may be TLP bonded to each other, to the metal core layer 232 and to the pair of metal outer layers 236L, 236U during TLP bonding of the semiconductor devices 120 to the substrate 110. However, the particles 234 (without the LMP coating) do not melt during TLP bonding of the semiconductor devices 120 to the substrate 110. Similarly, the metal core layer 232 and/or the pair of metal outer layers 236L, 236U may have a thin LMP coating (not shown) on surfaces in contact with the particles 234 such that the particles 234 may be TLP bonded to the metal core layer 232 and/or the pair of metal outer layers 236L, 236U during TLP bonding of the semiconductor devices 120 to the substrate 110.

Figure 5:
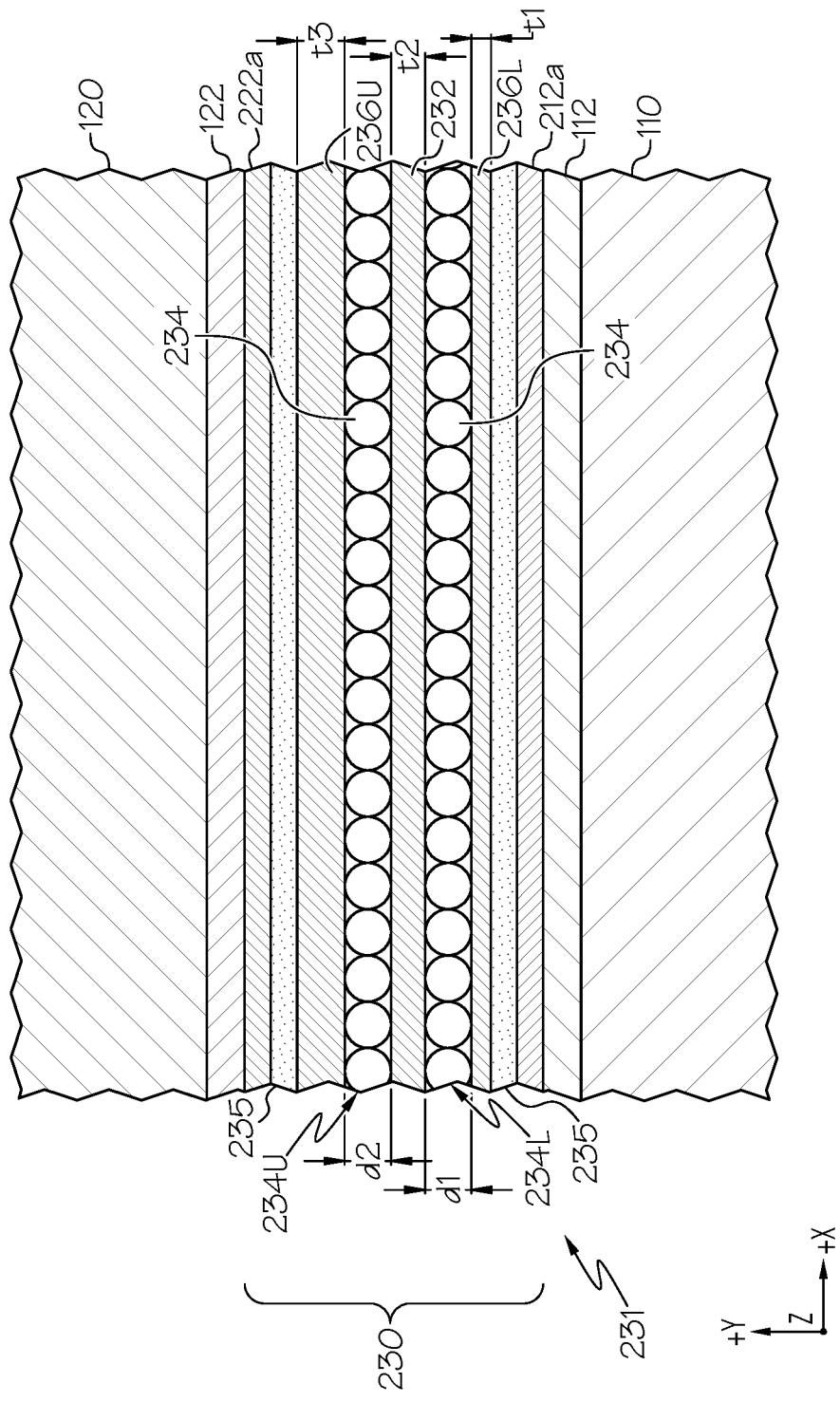
FIG. 5 schematically depicts an enlarged view of box 150 depicted in FIG. 1 according to one or more embodiments shown and described herein.

Referring now to FIG. 5, an enlarged view of the region designated by box 150 in FIG. 1 after the semiconductor devices 120 have been TLP bonded to the substrate 110 is schematically depicted. As illustrated in FIG. 5, after the semiconductor devices 120 have been TLP bonded to the substrate 110, the metal core layer 232, the pair of particle layers 234L, 234U, the pair of metal outer layers 136L, 136U, and the pair of bonding layers 235 remain as in FIG. 4. That is, the metal core layer 232, the pair of particle layers 234L, 234U, the pair of metal outer layers 236L, 236U, and the pair of bonding layers 235 do not melt during the TLP bonding process and generally remain the same thickness (Y direction) as before the TLP bonding process. It is understood that diffusion may occur between the metal core layer 232, the pair of particle layers 234L, 234U, the pair of particle layers 234L, 234U, and/or the pair of metal outer layers 236L, 236U during the TLP bonding process, but neither the metal core layer 232, the pair of particle layers 234L, 234U, the pair of metal outer layers 236L, 236U, nor the pair of bonding layers 235 melt during the TLP bonding process. In contrast, the pair of LMP bonding layers 233 at least partially melt and form TLP bond layers 212a and 222a. Although the TLP bond layers 212a and 222a depicted in FIG. 5 each comprise one layer between the bonding layer 112 and the adjacent bonding layer 235 (e.g., 212a), and one layer between the bonding layer 122 and the bonding layer 235 (e.g., 222a), respectively, in embodiments the TLP bond layers 212a and/or 222a may comprise two or more layers between the bonding layer 112 and the adjacent bonding layer 235, and the bonding layer 122 and the adjacent bonding layer 235, respectively. In other embodiments, the TLP bond layers 212a and/or 222a may comprise no layers, i.e., all of the bonding layers 235, 112 and 122 diffuse into the pair of metal outer layers 236L, 236U, substrate 110 and/or semiconductor device 120 thereby resulting in a clearly defined TLP bond layer 212a and/or 222a not being present.

Figure 6A:
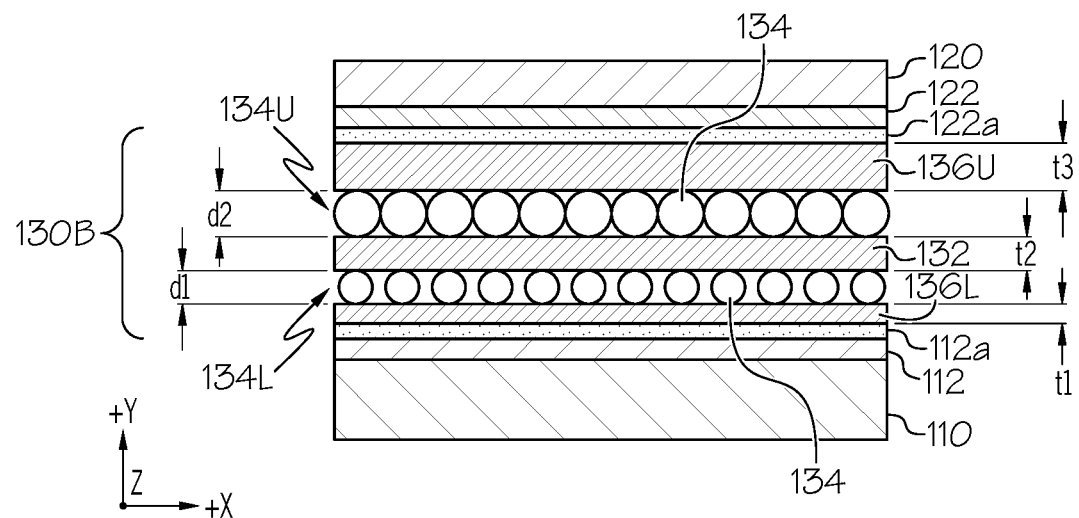
FIG. 6A schematically depicts an enlarged view of box 150 depicted in FIG. 1 according to one or more embodiments shown and described herein.
Figure 6B:
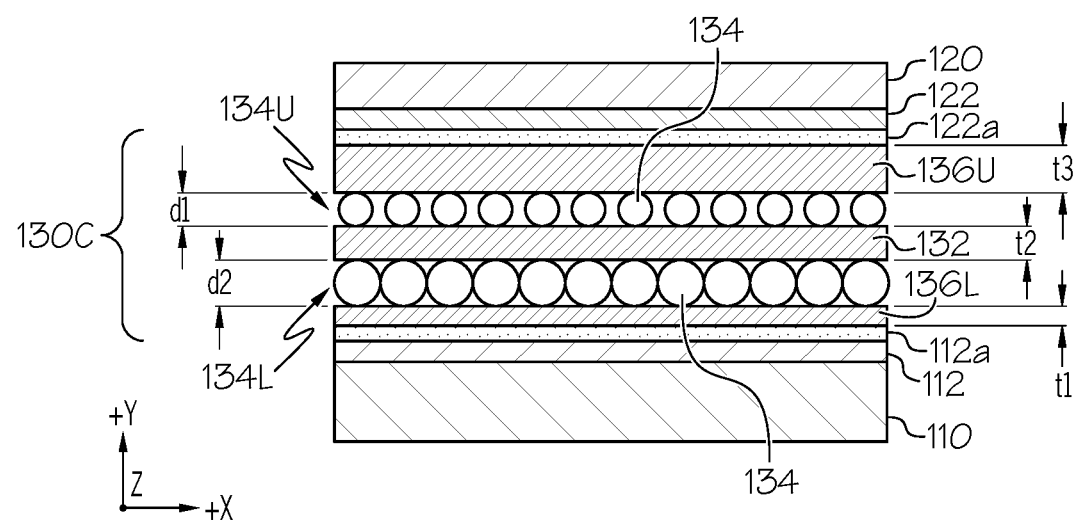
FIG. 6B schematically depicts an enlarged view of box 150 depicted in FIG. 1 according to one or more embodiments shown and described herein.

Referring back to FIG. 3, and as noted above, the particles 134 forming the lower particle layer 134L have an average particle diameter d1 and particles 134 forming the upper particle layer 134U have an average particle diameter d2 that is equal to d1 (i.e., d1=d2). However, in some embodiments, the average diameters d1 and d2 of the particles layers 134L and 134U, respectively, are not equal with one non-limiting example schematically depicted by the multilayer composite bonding material 130B shown in FIG. 6A. Particularly, the lower metal outer layer 136L has the same thickness t1, the metal core layer 132 has the same thickness t2 that is greater than t1, and the upper metal outer layer 136U has the same thickness t3 that is greater than t2 (i.e., t1<t2<t3) as depicted in FIG. 3. However, the particles 134 forming the lower particle layer 134L have an average particle diameter d1 and the particles 134 forming the upper particle layer 134U have an average particle diameter d2 that is greater than d1 (i.e., d1<d2). Another non-limiting example of the particles 134 forming the pair of particle layers 134L, 134U not having equal average diameters is schematically depicted by the multilayer composite bonding material 130C shown in FIG. 6B. Particularly, the particles 134 forming the lower particle layer 134L have an average particle diameter d1 and particles 134 forming the upper particle layer 134U have an average particle diameter d2 that is less than d1 (i.e., d1>d2). It should be understood that including particle layers with different average diameters may be used alter the overall stiffness, overall flexural strength, graded stiffness and/or graded flexural strength of the multilayer composite bonding materials described herein to compensate for thermally-induced stresses due to CTE mismatch between the substrate 110 and the semiconductor device 120.

Figure 7A:
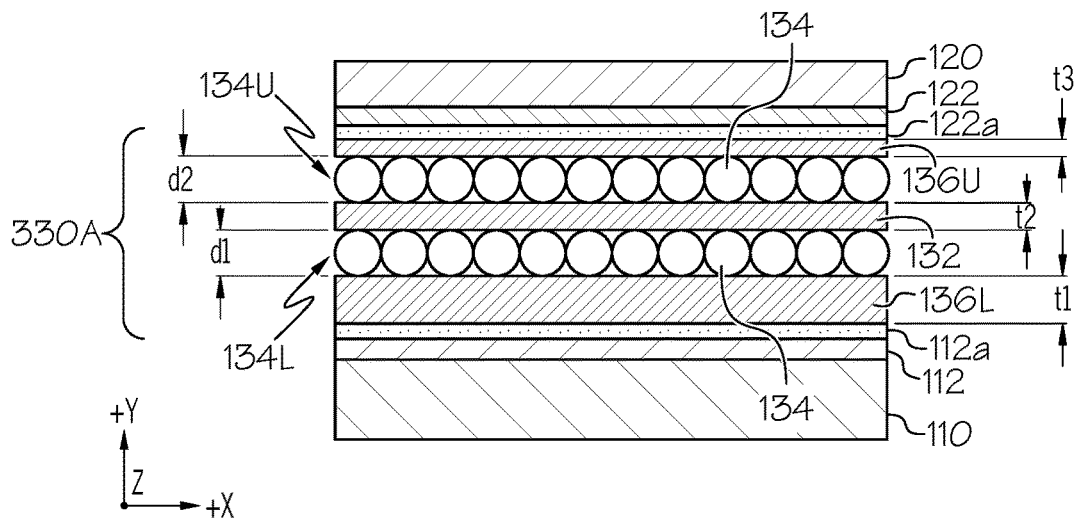
FIG. 7A schematically depicts an enlarged view of box 150 depicted in FIG. 1 according to one or more embodiments shown and described herein.

Referring now to FIG. 7A, a multilayer composite bonding material with a pair of outer metal layers that are thicker than a metal core layer is schematically depicted. Particularly, a multilayer composite bonding material 330A in FIG. 7A includes a lower metal outer layer 136L with a thickness t1, a metal core layer 132 with a thickness t2 that is less than t1, and an upper metal outer layer 136U with a thickness t3 that is less than t2 (i.e., t1>t2>t3). Accordingly, FIG. 7A depicts a multilayer composite bonding material with a decrease in metal layer thickness with increasing thickness (+Y direction) of the multilayer composite bonding material. In such an example, and in embodiments where the metal layers 136L, 132, 136U are formed from the same material, it should be understood that the flexural strength of the lower metal outer layer 136L is greater than the flexural strength of the metal core layer 132 since the thickness t1 is greater than t2, and the flexural strength of the metal core layer 132 is greater than the flexural strength of the upper metal outer layer 136U since the thickness t2 is greater than t3.

Figure 7B:
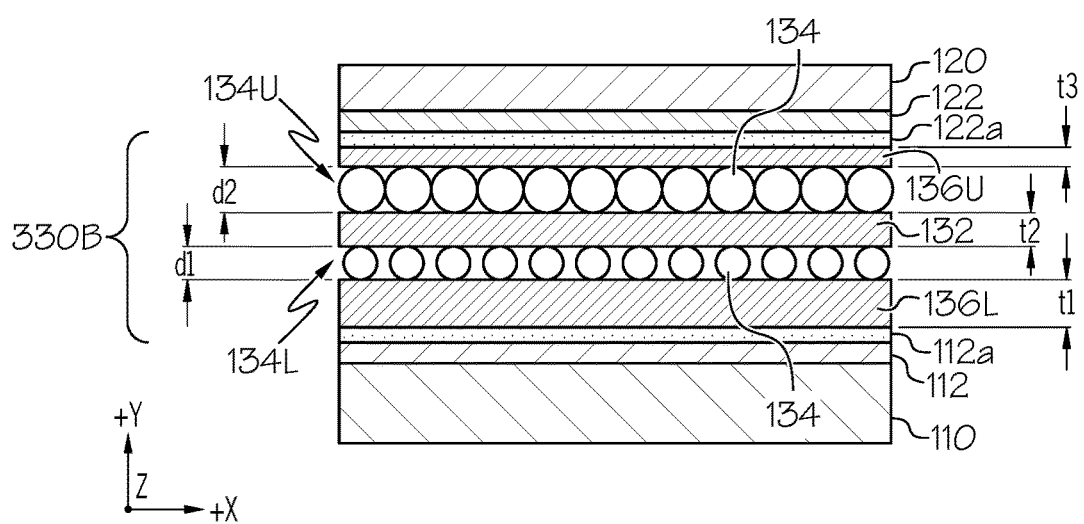
FIG. 7B schematically depicts an enlarged view of box 150 depicted in FIG. 1 according to one or more embodiments shown and described herein.
Figure 7C:
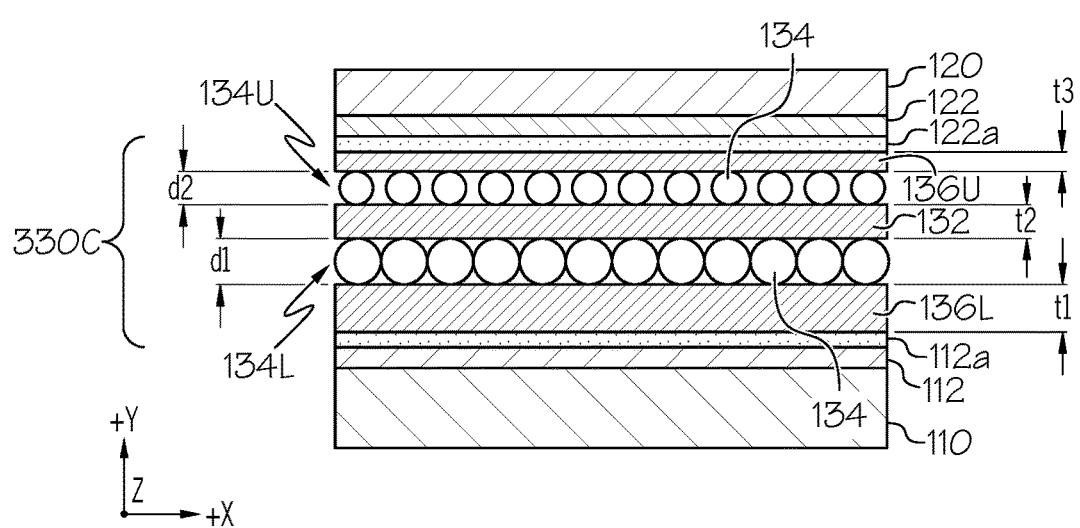
FIG. 7C schematically depicts an enlarged view of box 150 depicted in FIG. 1 according to one or more embodiments shown and described herein.

Similar to FIGS. 2-5, the multilayer composite bonding material 330A with decreasing metal layer thickness in FIG. 7A schematically depicts the average diameters d1 and d2 of the particles layers 134L and 134U, respectively, being equal (i.e., d1=d2). However, in some embodiments, the average diameters d1 and d2 of the particles layers 134L and 134U, respectively, are not equal. One non-limiting example is schematically depicted by the multilayer composite bonding material 330B shown in FIG. 7B. Particularly, the particles 134 forming the lower particle layer 134L have an average particle diameter d1 and the particles 134 forming the upper particle layer 134U have an average particle diameter d2 that is greater than d1 (i.e., d1<d2). Another non-limiting example of the pair of particle layers 134L, 134U not having equal average diameters is schematically depicted by the multilayer composite bonding material 330C shown in FIG. 7C. Particularly, the particles 134 forming the lower particle layer 134L have an average particle diameter d1 and particles 134 forming the upper particle layer 134U have an average particle diameter d2 that is less than d1 (i.e., d1>d2).

Figure 8A:
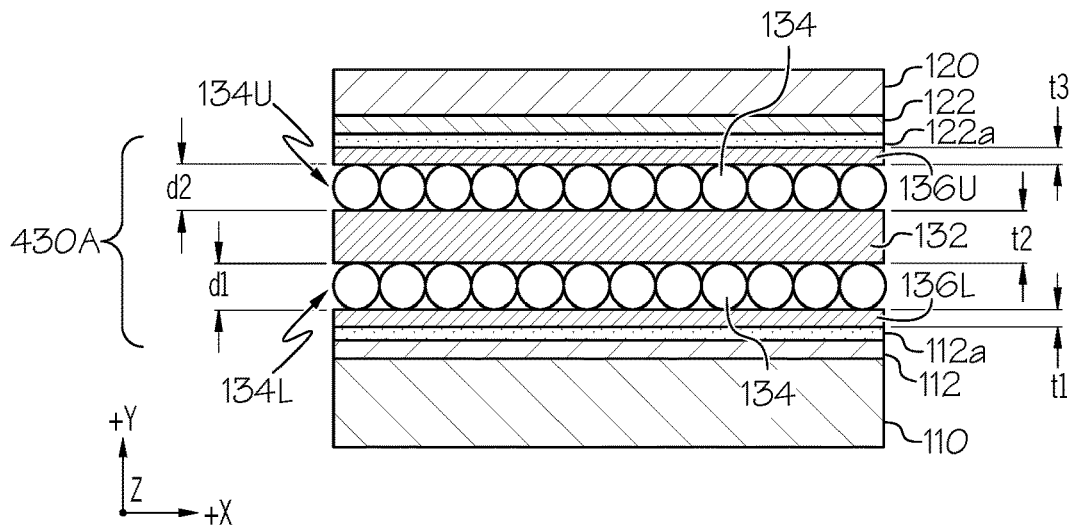
FIG. 8A schematically depicts an enlarged view of box 150 depicted in FIG. 1 according to one or more embodiments shown and described herein.

Referring now to FIG. 8A, a multilayer composite bonding material with a pair of outer metal layers that are thinner than a metal core layer is schematically depicted. Particularly, a multilayer composite bonding material 430A in FIG. 8A includes a lower metal outer layer 136L with a thickness t1, a metal core layer 132 with a thickness t2 that is greater than t1, and a upper metal outer layer 136U with a thickness t3 that is less than t2 (i.e., t1<t2>t3). In some embodiments, the thickness t1 of the lower metal outer layer 136L is equal to the thickness t3 of the upper metal outer layer 136U (i.e., t1=t3). In other embodiments, the thickness t1 of the lower metal outer layer 136L is not equal to the thickness t3 of the upper metal outer layer 136U (i.e., t1≠t3), however both of the metal outer layers 136L, 136U have a thickness that is less than the thickness of the metal core layer 132. Accordingly, the multilayer composite bonding material 430A schematically depicts an increase in metal layer thickness from the substrate 110 to a middle or center portion of the multilayer composite bonding material 430A (+Y direction) and an increase in metal layer thickness from the semiconductor device 120 to the middle or center portion of the multilayer composite bonding material 430A (−Y direction). It should be understood that in at least the embodiments where the metal layers 132, 136L, 136U are formed from the same material, the flexural strengths of the lower metal outer layer 136L and the upper metal outer layer 136U are less than the flexural strength of the metal core layer 132 since the thicknesses t1 and t3 are less than t2. Accordingly, FIG. 8A schematically depicts a multilayer composite bonding material with outer portions that are more flexible than the middle portion.

Figure 8B:
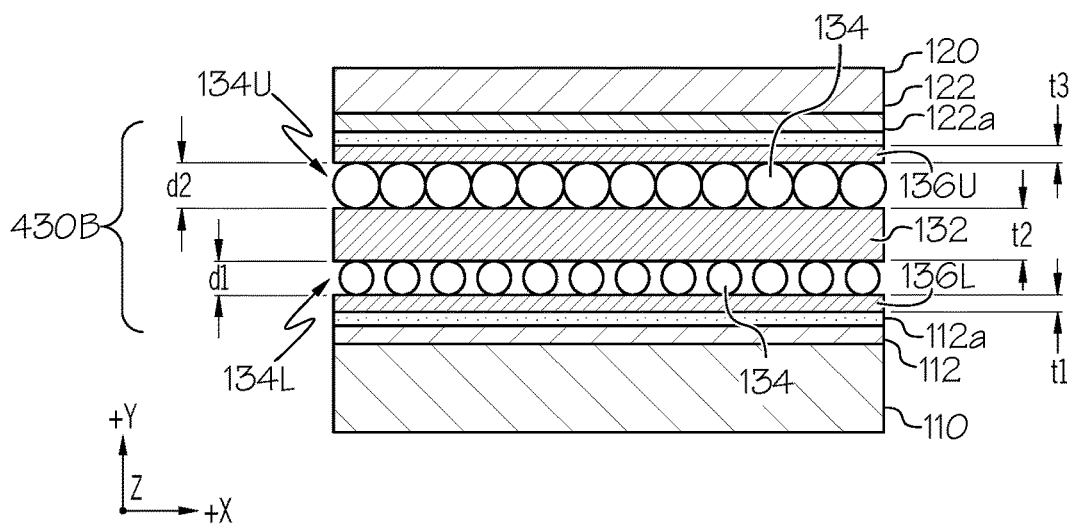
FIG. 8B schematically depicts an enlarged view of box 150 depicted in FIG. 1 according to one or more embodiments shown and described herein.
Figure 8C:
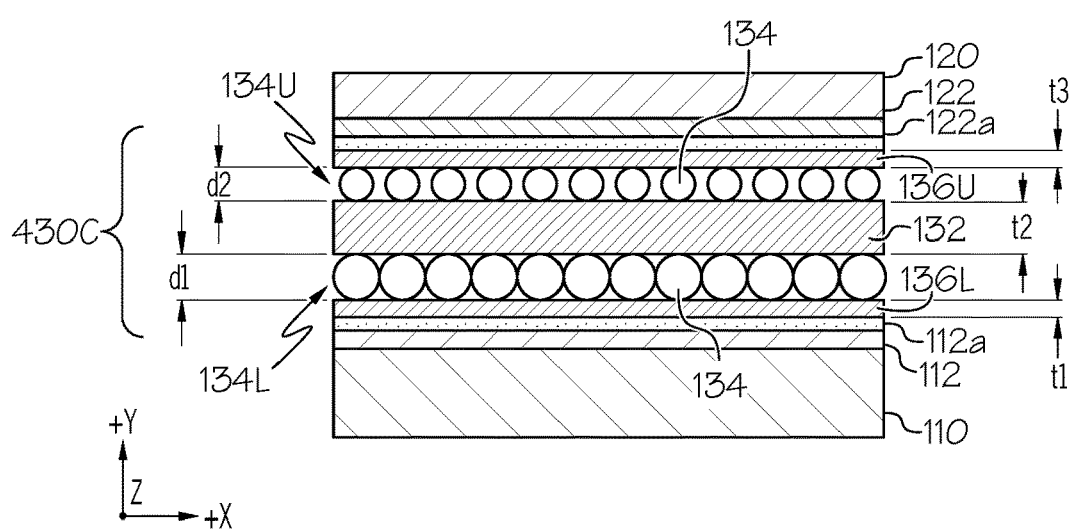
FIG. 8C schematically depicts an enlarged view of box 150 depicted in FIG. 1 according to one or more embodiments shown and described herein.

Similar to the embodiments schematically depicted in FIGS. 2-5, the average diameters d1 and d2 of the particles layers 134L and 134U, respectively, in the multilayer composite bonding material 430A are equal (i.e., d1=d2). However, in some embodiments, the average diameters d1 and d2 of the particles layers 134L and 134U, respectively, are not equal. One non-limiting example is schematically depicted by the multilayer composite bonding material 430B shown in FIG. 8B. Particularly, the particles 134 forming the lower particle layer 134L have an average particle diameter d1 and the particles 134 forming the upper particle layer 134U have an average particle diameter d2 that is greater than d1 (i.e., d1<d2). Another non-limiting example of the pair of particle layers 134L, 134U not having equal average diameters is schematically depicted by the multilayer composite bonding material 430C shown in FIG. 8C. Particularly, the particles 134 forming the lower particle layer 134L have an average particle diameter d1 and particles 134 forming the upper particle layer 134U have an average particle diameter d2 that is less than d1 (i.e., d1>d2).

Figure 9A:
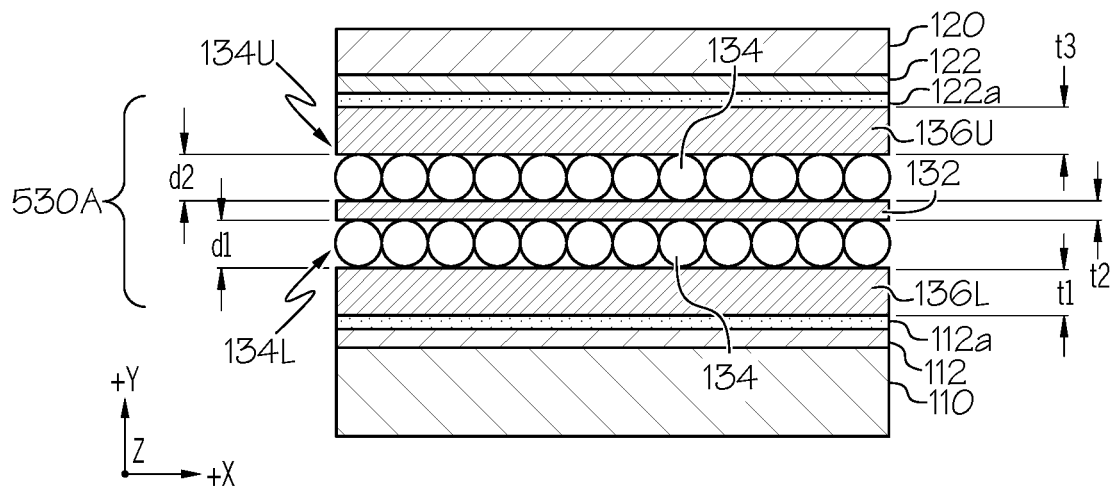
FIG. 9A schematically depicts an enlarged view of box 150 depicted in FIG. 1 according to one or more embodiments shown and described herein.

Referring now to FIG. 9A a multilayer composite bonding material with a pair of outer metal layers that are thicker than a metal core layer is schematically depicted. Particularly, a multilayer composite bonding material 530A in FIG. 9A includes a lower metal outer layer 136L with a thickness t1, a metal core layer 132 with a thickness t2 that is less than t1, and an upper metal outer layer 136U with a thickness t3 that is greater than t2 (i.e., t1>t2<t3). In some embodiments, the thickness t1 of the lower metal outer layer 136L is equal to the thickness t3 of the upper metal outer layer 136U (i.e., t1=t3). In other embodiments, the thickness t1 of the lower metal outer layer 136L is not equal to the thickness t3 of the upper metal outer layer 136U (i.e., t1≠t3), however the pair of metal outer layers 136L, 136U have a thickness greater than the thickness of the metal core layer 132. Accordingly, FIG. 9A schematically depicts a multilayer composite bonding material with a decrease in metal layer thickness from the substrate 110 to a middle or center portion of the multilayer composite bonding material 530A (+Y direction) and a decrease in metal layer thickness from the semiconductor device 120 to the middle or center portion of the multilayer composite bonding material 530A (−Y direction). It should be understood that in at least the embodiments where the metal layers 132, 136L, 136U are formed from the same material, the flexural strengths of the lower metal outer layer 136L and the upper metal outer layer 136U are greater than the flexural strength of the metal core layer 132 since the thicknesses t1 and t3 are greater than t2.

Figure 9B:
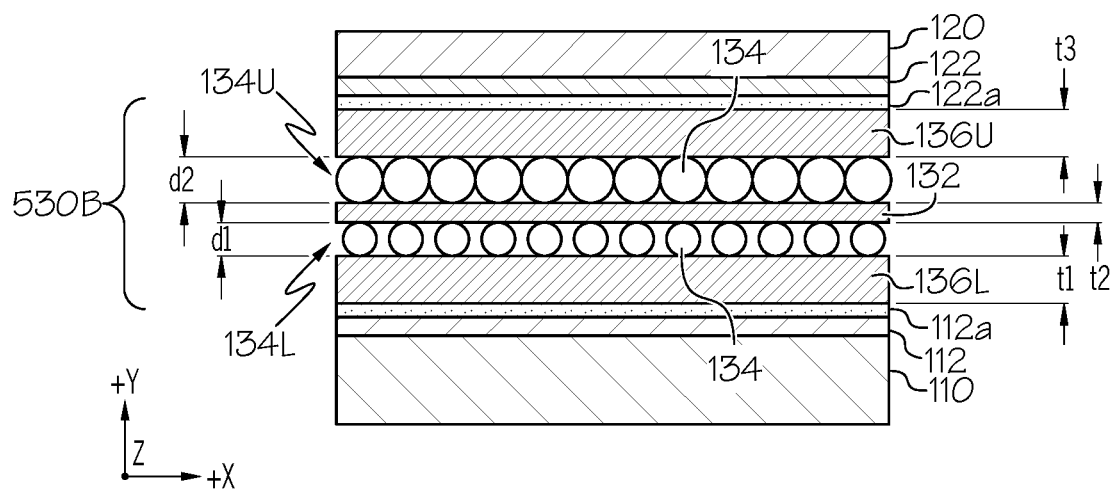
FIG. 9B schematically depicts an enlarged view of box 150 depicted in FIG. 1 according to one or more embodiments shown and described herein.
Figure 9C:
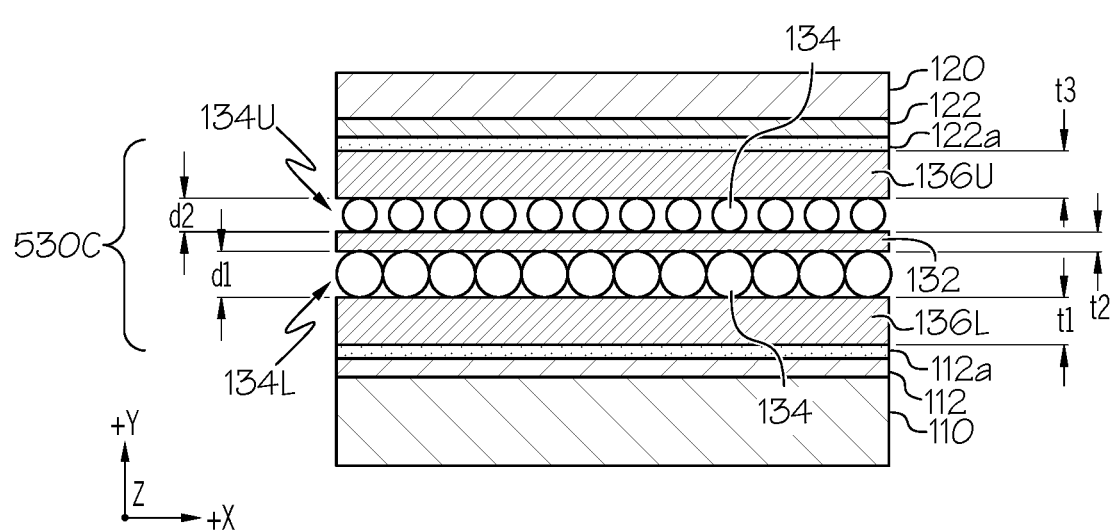
FIG. 9C schematically depicts an enlarged view of box 150 depicted in FIG. 1 according to one or more embodiments shown and described herein.

Similar to the embodiments schematically depicted in FIGS. 2-5, the average diameters d1 and d2 of the particles layers 134L and 134U, respectively, in the multilayer composite bonding material 530A are equal (i.e., d1=d2). However, in some embodiments, the average diameters d1 and d2 of the particles layers 134L and 134U, respectively, are not equal. One non-limiting example is schematically depicted by the multilayer composite bonding material 530B shown in FIG. 9B. Particularly, the particles 134 forming the lower particle layer 134L have an average particle diameter d1 and the particles 134 forming the upper particle layer 134U have an average particle diameter d2 that is greater than d1 (i.e., d1<d2). Another non-limiting example of the pair of particle layers 134L, 134U not having equal average diameters is schematically depicted by the multilayer composite bonding material 530C shown in FIG. 9C. Particularly, the particles 134 forming the lower particle layer 134L have an average particle diameter d1 and particles 134 forming the upper particle layer 134U have an average particle diameter d2 that is less than d1 (i.e., d1>d2).

Figure 10:
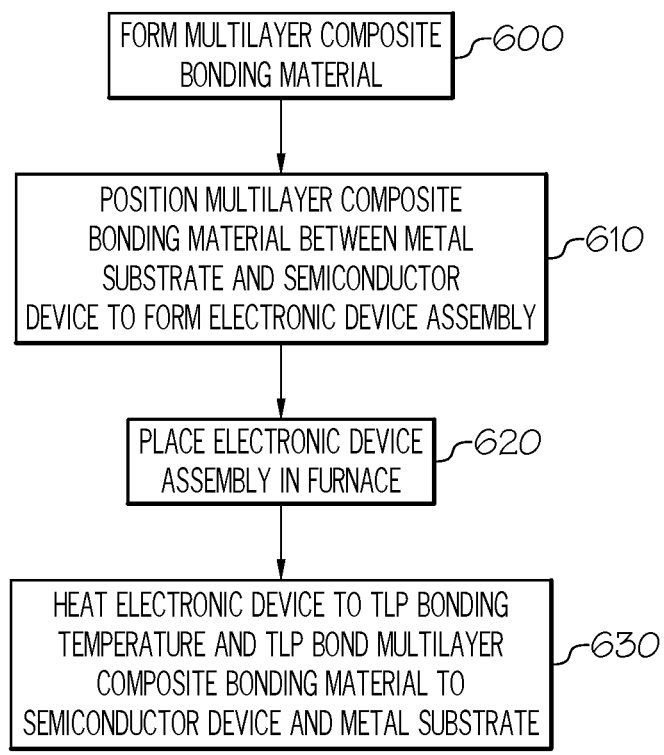
FIG. 10 schematically depicts a process of bonding a thermal stress compensation layer to a power semiconductor device and a substrate according to one or more embodiments shown and described herein.

Referring now to FIG. 10, a non-limiting example of a process for thermally bonding a power semiconductor device to a substrate with a multilayer composite bonding material is depicted. Particularly, at step 600 a multilayer composite bonding material 130A is formed. In embodiments, the multilayer composite bonding material 130A comprises the plurality of thermal stress compensation layers 131 that include the metal core layer 132, the pair of particles layers 134L, 134U, and the pair of metal outer layers 136L, 136U. The metal core layer 132 may be sandwiched between and in direct contact with the pair of particle layers 134L, 134U, and the pair of particle layers 134L, 134U may be sandwiched between and in direct contact with the pair of metal outer layers 136L, 136U. In one embodiment, the metal core layer 132 has a first stiffness and the pair of metal outer layers 136L, 136U each have a second stiffness that is different than the first stiffness. In the alternative, or in addition to, the metal core layer 132 has a first flexural strength and the pair of metal outer layers 136L, 136U each have a second flexural strength that is different than the first flexural strength. The plurality of thermal stress compensation layers 131 may be sandwiched between and in direct contact with the pair of LMP bonding layers 133. The pair of LMP bonding layers 133 have a melting point that is less than a melting point of any of the thermal stress compensation layers 131. Particularly, the pair of bonding layers 133 have a melting point that is less than a TLP sintering temperature used to TLP bond the semiconductor device 120 to the substrate 110, and the metal core layer 132, the pair of particle layers 134L, 134U, and the pair of metal outer layers 136L, 136U have a melting temperature that is greater than the TLP sintering temperature. The substrate 110 may have a bonding layer 112 extending across a surface of the substrate proximate to and facing the multilayer composite bonding material 130A and the semiconductor device 120 may have a bonding layer 122 extending across a surface of the semiconductor device 120 proximate to and facing the multilayer composite bonding material 130A.

Still referring to FIG. 10, at step 610 the multilayer composite bonding material 130A is brought into direct contact with the substrate 110 and the semiconductor device 120 to provide a electronic device assembly. In embodiments where the plurality of thermal stress compensation layers 131 are sandwiched between the pair of LMP bonding layers 133, the substrate 110 has the bonding layer 112, and the semiconductor device 120 has the bonding layer 122, the pair of bonding layers 133 are brought into direct contact with the bonding layer 112 and the bonding layer 122. In some embodiments, a force is applied to the semiconductor device 120 in order to ensure contact between the substrate 110 (or bonding layer 112), multilayer composite bonding material 130A and semiconductor device 120 (or bonding layer 122) is maintained during the TLP bonding process. Also, the force may ensure the semiconductor device 120 does not move relative to the substrate 110 during the TLP bonding process. At step 620 the electronic device assembly is placed in a furnace. At step 630 the electronic device assembly is heated to a TLP sintering temperature thereby resulting in TLP bonding of the substrate 110 to the semiconductor device 120. It should be understood that the furnace may comprise an inert or reducing gas atmosphere. Illustrative examples of inert gas atmospheres include but are not limited to atmospheres of helium, argon, neon, xenon, krypton, radon and combinations thereof. Illustrative examples of reducing gas atmospheres include but are not limited to hydrogen, argon plus hydrogen, helium plus hydrogen, neon plus hydrogen, xenon plus hydrogen, krypton plus hydrogen, radon plus hydrogen, and combinations thereof. After heating to the TLP sintering temperature, the electronic device assembly is cooled to ambient temperature. As used herein, the term "ambient temperature" refers to room temperature, e.g., to a temperature less than about 25° C. such as between about 20° C. and 22° C.

Upon heating the electronic device assembly to the TLP sintering temperature, the pair of LMP bonding layers 133 at least partially melt and diffuse into substrate 110, semiconductor device 120 and the pair of metal outer layers 136L, 136U. Not being bound by theory, as the bonding layers 112, 122, 133 diffuse into surrounding material the composition of the bonding layers 112, 122, 133 is altered such that isothermal solidification of TLP bonding layers 112a and 122a occurs and TLP bonding between the substrate 110 and the adjacent metal outer layer 136L, and between semiconductor device 120 and the adjacent metal outer layer 136U, is provided. That is, the semiconductor device 120 is thermally bonded to the substrate 110.

Figure 11:
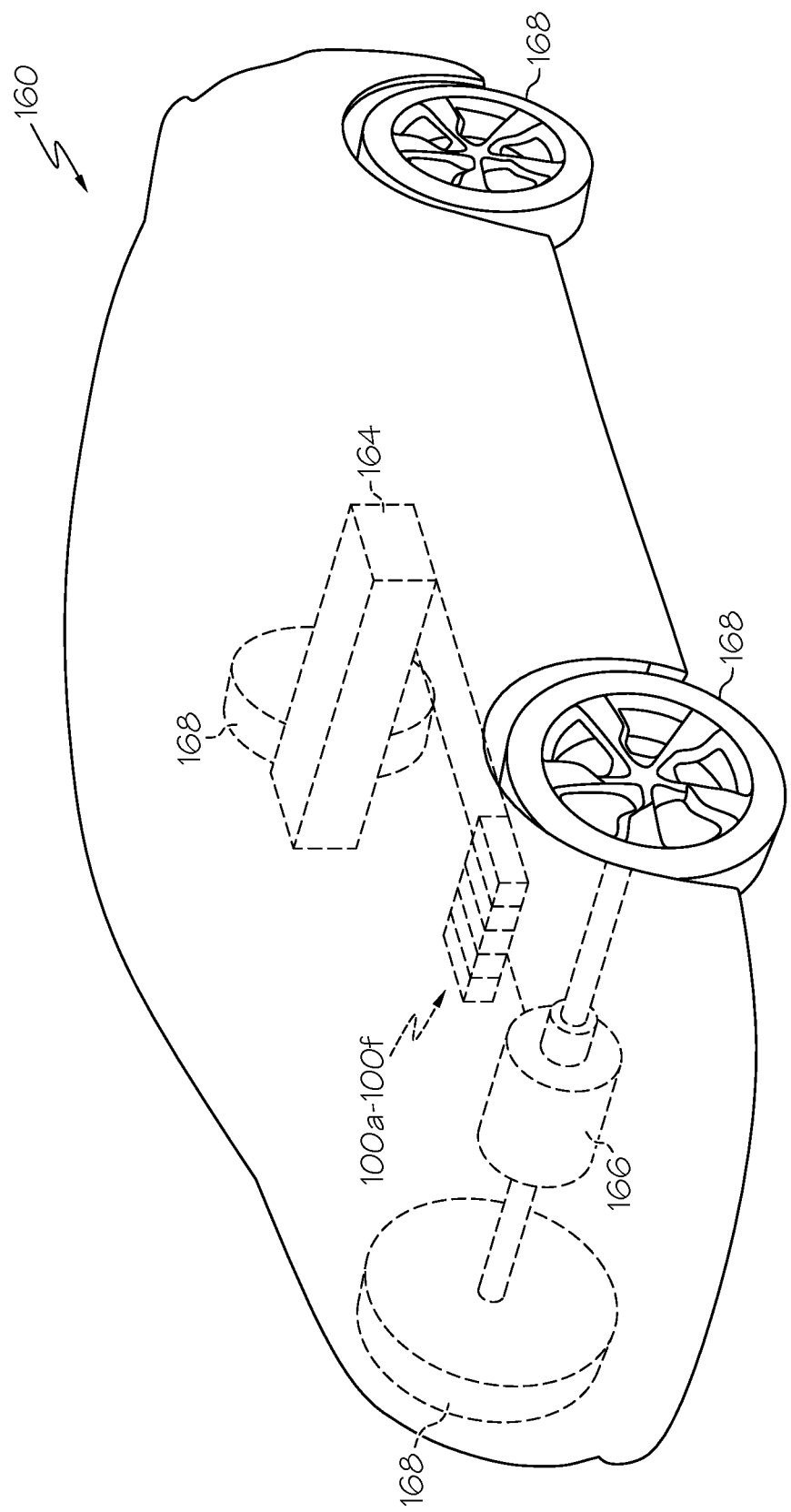
FIG. 11 schematically depicts a vehicle having a plurality of power electronics assemblies according to one or more embodiments shown and described herein.

Referring now to FIG. 11, another non-limiting example of a process for thermally bonding a power semiconductor device to a substrate with a multilayer composite bonding material is depicted. Particularly, at step 700 a substrate (e.g., substrate 110) is provided and a first metal outer layer (e.g., metal outer layer 136L) is positioned on the substrate 110 at step 710. A first particle layer (e.g., particle layer 134L) is positioned on the first metal outer layer at step 720 and a metal core layer (e.g., metal core layer 132) is positioned on the first particle layer at step 730. The first particle layer may be positioned on the first metal outer layer using a conventional or yet to be developed method and/or technique for positioning or arranging particles on a surface. Non-limiting examples of positioning the first particle layer on the first metal outer layer, and other particle layers described herein, include 3D printing the first particle layer on the first metal outer layer, spreading a paste with the particles across the first metal outer layer using a knife to from the first particle layer, and the like. A second particle layer (e.g., particle layer 134U) is positioned on the metal core layer at step 740, a second metal outer layer (e.g., metal outer layer 136U) is positioned on the second particle layer at step 750, and a semiconductor device (e.g., semiconductor device 120) is positioned on the second metal outer layer at step 760. The substrate, metal layers, particle layers and semiconductor device form an electronic device assembly that is heated at step 770 to a TLP bonding temperature such that the substrate, metal layers, particle layers and semiconductor device are TLP bonded together to form a power electronics assembly. It should be understood that the electronic device assembly may be heated to the TLP bonding temperature within a furnace and the furnace may comprise an inert or reducing gas atmosphere.

As stated above, the substrates and power electronics assemblies described herein may be incorporated into an inverter circuit or system that converts direct current electrical power into alternating current electrical power and vice versa depending on the particular application. For example, in a hybrid electric vehicle application as illustrated in FIG. 12, several power electronics assemblies 100a-100f may be electrically coupled together to form a drive circuit that converts direct current electrical power provided by a bank of batteries 164 into alternating electrical power that is used to drive an electric motor 166 coupled to the wheels 168 of a vehicle 160 to propel the vehicle 160 using electric power. The power electronics assemblies 100a-100f used in the drive circuit may also be used to convert alternating current electrical power resulting from use of the electric motor 166 and regenerative braking back into direct current electrical power for storage in the bank of batteries 164.

Power semiconductor devices utilized in such vehicular applications may generate a significant amount of heat during operation, which require bonds between the semiconductor devices and substrates that can withstand higher temperatures and thermally-induced stresses due to CTE mismatch. The multilayer composite bonding materials described and illustrated herein may compensate for the thermally-induced stresses generated during thermal bonding of the semiconductor devices to the substrate with a graded stiffness and/or graded flexural strength across the thickness of the multilayer composite bonding material while also providing a compact package design. For example, in embodiments where a lower surface of a multilayer composite bonding material is TLP bonded to a component with a large CTE (e.g., an Al substrate), the multilayer composite bonding material may be formed with a lower metal outer layer comprising a low stiffness and/or a low flexural strength in order to compensate for the large expansion and contraction of the component during TLP bonding of a semiconductor device.

It should now be understood that the multilayer composite bonding materials incorporated into the power electronics assemblies and vehicles described herein may be utilized to compensate thermally-induced stresses due to CTE mismatch without the need for additional interface layers, thereby providing for a more compact package design with reduced thermal resistance.

It is noted that the terms "about" and "generally" may be utilized herein to represent the inherent degree of uncertainty that may be attributed to any quantitative comparison, value, measurement, or other representation. This term is also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A multilayer composite bonding material for transient liquid phase bonding comprising:
    a plurality of thermal stress compensation layers comprising:
        a metal core layer;
        a pair of particle layers extending across the metal core layer such that the metal core layer is sandwiched between the pair of particle layers; and
        a pair of metal outer layers extending across the pair of particle layers such that the pair of particle layers are sandwiched between the pair of metal outer layers;
    a pair of low melting point (LMP) bonding layers extending across the pair of metal outer layers such that the plurality of thermal stress compensation layers are sandwiched between the pair of LMP bonding layers;
    wherein:
        the metal core layer, the pair of particle layers, and the pair of metal outer layers each have a melting point above a transient liquid phase (TLP) sintering temperature and the pair of LMP bonding layers each have a melting point below the TLP sintering temperature;
        the TLP sintering temperature is in a range between about 280° C. and 350° C.; and
        the multilayer composite bonding material comprises a graded stiffness or a graded flexural strength as a function of a thickness of the multilayer composite bonding material.

2. The multilayer composite bonding material of claim 1, wherein the metal core layer comprises a first stiffness and the pair of metal outer layers each comprise a second stiffness.

3. The multilayer composite bonding material of claim 2, wherein the first stiffness is greater than the second stiffness.

4. The multilayer composite bonding material of claim 2, wherein the first stiffness is less than the second stiffness.

5. The multilayer composite bonding material of claim 1, wherein a thickness of the metal core layer is greater than a thickness of each of the pair of metal outer layers.

6. The multilayer composite bonding material of claim 4, wherein a flexural strength of the metal core layer is greater than a flexural strength of each of the pair of metal outer layers.

7. The multilayer composite bonding material of claim 1, wherein a thickness of the metal core layer is less than a thickness of each of the pair of metal outer layers.

8. The multilayer composite bonding material of claim 7, wherein a flexural strength of the metal core layer is less than a flexural strength of each of the pair of metal outer layers.

9. The multilayer composite bonding material of claim 1, wherein an average diameter of particles that form one of the pair of particle layers is greater than an average diameter of particles that form another of the pair of particle layers.

10. The multilayer composite bonding material of claim 1, wherein thicknesses of the pair of metal outer layers are not equal.

11. The multilayer composite bonding material of claim 8, wherein a thickness of the metal core layer is greater than a thickness of one of the pair of metal outer layers and less than a thickness of another of the pair of metal outer layers.

12. A power electronics assembly comprising:
    a semiconductor device extending across a substrate; and
    a multilayer composite bonding material sandwiched between and transient liquid phase (TLP) bonded to the semiconductor device and the substrate, the multilayer composite bonding material comprising:
        a metal core layer;
        a pair of particle layers extending across the metal core layer such that the metal core layer is sandwiched between the pair of particle layers; and
        a pair of metal outer layers extending across the pair of particle layers such that the pair of particle layers are sandwiched between the pair of metal outer layers;
    wherein:
        the metal core layer, the pair of particle layers, and the pair of metal outer layers each have a melting point above a transient liquid phase (TLP) sintering temperature and the pair of LMP bonding layers each have a melting point below the TLP sintering temperature; and
        the TLP sintering temperature is in a range between about 280° C. and 350° C.

13. The multilayer composite bonding material of claim 12, wherein the metal core layer comprises a first stiffness and the pair of metal outer layers each comprise a second stiffness that is not equal to the first stiffness.

14. The multilayer composite bonding material of claim 13, wherein the first stiffness is greater than the second stiffness.

15. The multilayer composite bonding material of claim 13, wherein the first stiffness is less than the second stiffness.

16. The multilayer composite bonding material of claim 12, wherein a thickness of the metal core layer is greater than a thickness of each of the pair of metal outer layers and a flexural strength of the metal core layer is greater than a flexural strength of each of the pair of metal outer layers.

17. The multilayer composite bonding material of claim 12, wherein a thickness of the metal core layer is less than a thickness of each of the pair of metal outer layers and a flexural strength of the metal core layer is less than a flexural strength of each of the pair of metal outer layers.

18. A process for manufacturing a power electronics assembly comprising:
- positioning a multilayer composite bonding material between a substrate and a semiconductor device to provide a substrate/semiconductor device assembly, the multilayer composite bonding material comprising a metal core layer with a first stiffness and a first flexural strength, a pair of particle layers extending across the metal core layer such that the metal core layer is sandwiched between the pair of particle layers, a pair of metal outer layers with a second stiffness and a second flexural strength extending across the pair of particle layers such that the pair of particle layers are sandwiched between the pair of metal outer layers, and a pair of low melting point (LMP) bonding layers extending across the pair of metal outer layers such that the pair of metal outer layers are sandwiched between the pair of LMP bonding layers;
- heating the substrate/semiconductor device assembly to a transient liquid phase (TLP) sintering temperature between about 280° C. and 350° C., wherein the pair of LMP bonding layers each have a melting point less than the TLP sintering temperature and the metal core layer, the pair of particle layers, and the pair of metal outer layers each have a melting point greater than the TLP sintering temperature such that the pair of LMP bonding layers at least partially melt and form a TLP bond with the substrate and the semiconductor device; and
- cooling the power electronics assembly from the TLP sintering temperature to ambient temperature, wherein the multilayer composite bonding material compensates for thermal contraction mismatch between the semiconductor device and the substrate during cooling from the TLP sintering temperature to ambient temperature.

19. The process of claim 18, wherein the first stiffness is not equal to the second stiffness.

20. The process of claim 18, wherein the first flexural strength is not equal to the second flexural strength.

* * * * *

UNITED STATES PATENT AND TRADEMARK OFFICE
CERTIFICATE OF CORRECTION

PATENT NO. : 10,751,840 B2
APPLICATION NO. : 15/883890
DATED : August 25, 2020
INVENTOR(S) : Shailesh N. Joshi and Ercan M. Dede It is certified that error appears in the above-identified patent and that said Letters Patent is hereby corrected as shown below:

In the Specification

Column 8, Line(s) 32, after "$E_{Cu}$", delete "=" and insert --≈--, therefor.

Column 8, Line(s) 52, table 1, after "($E_{CL} < E_{OL}$", insert --)--.

Signed and Sealed this
Sixth Day of October, 2020

Andrei Iancu
*Director of the United States Patent and Trademark Office*